(12) United States Patent
Lin et al.

(10) Patent No.: US 11,600,717 B2
(45) Date of Patent: Mar. 7, 2023

(54) DUMMY FIN PROFILE CONTROL TO ENLARGE GATE PROCESS WINDOW

(71) Applicant: Taiwan Semiconductor Manufacturing Co., Ltd., Hsinchu (TW)

(72) Inventors: Shih-Yao Lin, New Taipei (TW); Pei-Hsiu Wu, New Taipei (TW); Chih Ping Wang, Hsinchu (TW); Chih-Han Lin, Hsinchu (TW); Jr-Jung Lin, Hsinchu (TW); Yun Ting Chou, Taipei (TW); Chen-Yu Wu, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 181 days.

(21) Appl. No.: 17/069,460

(22) Filed: Oct. 13, 2020

(65) Prior Publication Data

US 2021/0367059 A1     Nov. 25, 2021

Related U.S. Application Data

(60) Provisional application No. 63/027,599, filed on May 20, 2020.

(51) Int. Cl.
   *H01L 29/66*      (2006.01)
   *H01L 29/78*      (2006.01)
   (Continued)

(52) U.S. Cl.
   CPC .... *H01L 29/6681* (2013.01); *H01L 21/28518* (2013.01); *H01L 21/31111* (2013.01);
   (Continued)

(58) Field of Classification Search
   CPC ........... H01L 29/6681; H01L 21/28518; H01L 21/31111; H01L 21/31116; H01L 29/0649;
   (Continued)

(56) References Cited

U.S. PATENT DOCUMENTS

| | | | |
|---|---|---|---|
| 9,331,074 B1 * | 5/2016 | Chang | ............... H01L 29/517 |
| 9,935,103 B2 | 4/2018 | Chang et al. | |
| 10,868,001 B2 | 12/2020 | Ching et al. | |
| 10,991,825 B2 | 4/2021 | Kim et al. | |
| 11,107,813 B2 | 8/2021 | Lin | |

(Continued)

FOREIGN PATENT DOCUMENTS

| | | |
|---|---|---|
| KR | 20150090796 A | 8/2015 |
| KR | 101709395 B1 | 2/2017 |
| KR | 20170095174 A | 8/2017 |

(Continued)

*Primary Examiner* — Monica D Harrison
*Assistant Examiner* — Andre C Stevenson
(74) *Attorney, Agent, or Firm* — Slater Matsil, LLP

(57) ABSTRACT

A method includes forming isolation regions extending into a semiconductor substrate, wherein semiconductor strips are located between the isolation regions, and forming a dielectric dummy strip between the isolation regions, recessing the isolation regions. Some portions of the semiconductor strips protrude higher than top surfaces of the recessed isolation regions to form protruding semiconductor fins, and a portion of the dielectric dummy strip protrudes higher than the top surfaces of the recessed isolation regions to form a dielectric dummy fin. The method further includes etching the dielectric dummy fin so that a top width of the dielectric dummy fin is smaller than a bottom width of the dielectric dummy fin. A gate stack is formed on top surfaces and sidewalls of the protruding semiconductor fins and the dielectric dummy fin.

20 Claims, 29 Drawing Sheets

(51) Int. Cl.
   *H01L 29/06*      (2006.01)
   *H01L 21/311*     (2006.01)
   *H01L 21/285*     (2006.01)

(52) U.S. Cl.
   CPC .... *H01L 21/31116* (2013.01); *H01L 29/0649* (2013.01); *H01L 29/66545* (2013.01); *H01L 29/66636* (2013.01); *H01L 29/7851* (2013.01)

(58) Field of Classification Search
   CPC ......... H01L 29/66545; H01L 29/66636; H01L 29/7851; H01L 21/823431; H01L 29/66795–66818
   See application file for complete search history.

(56) References Cited

U.S. PATENT DOCUMENTS

| | | | |
|---|---|---|---|
| 2014/0117426 A1* | 5/2014 | Cho | H01L 21/7624 438/689 |
| 2015/0214341 A1 | 7/2015 | Shin et al. | |
| 2015/0311311 A1* | 10/2015 | Fumitake | H01L 27/0922 438/587 |
| 2018/0204932 A1 | 7/2018 | Mehandru et al. | |
| 2019/0067444 A1* | 2/2019 | Ching | H01L 21/02057 |
| 2019/0074224 A1* | 3/2019 | Xie | H01L 29/0649 |
| 2020/0091142 A1 | 3/2020 | Ching et al. | |

FOREIGN PATENT DOCUMENTS

| | | |
|---|---|---|
| KR | 101801006 B1 | 11/2017 |
| KR | 20190108332 A | 9/2019 |
| TW | 201837995 A | 10/2018 |

\* cited by examiner

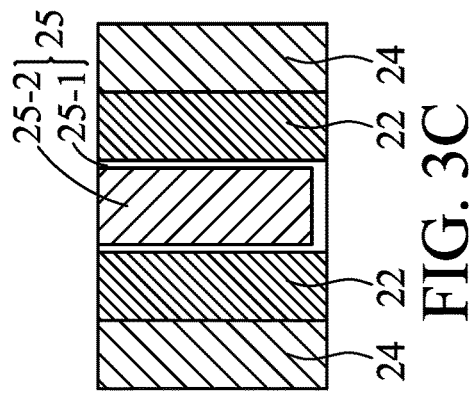
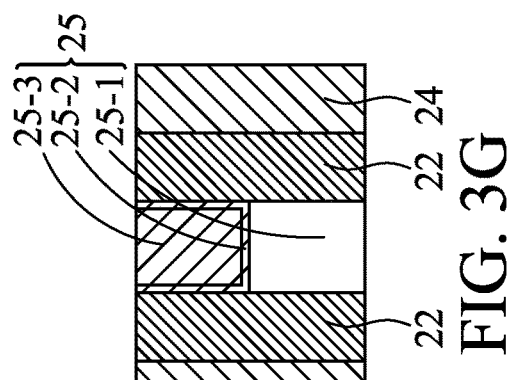
FIG. 3A  FIG. 3B  FIG. 3C
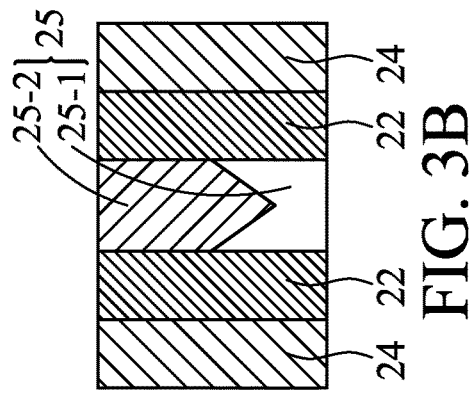
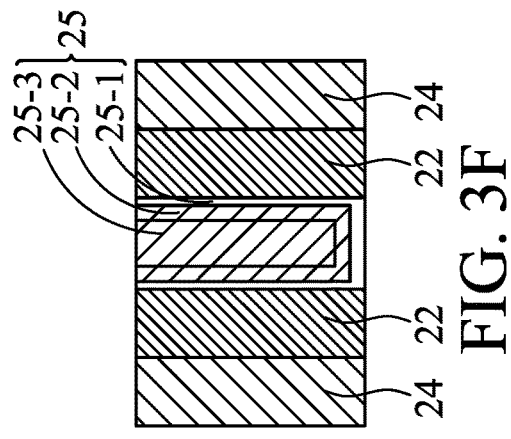
FIG. 3D  FIG. 3E  FIG. 3F
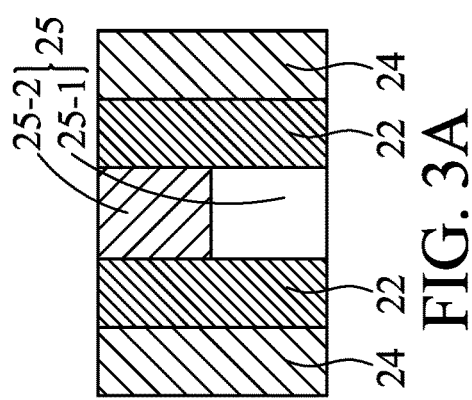
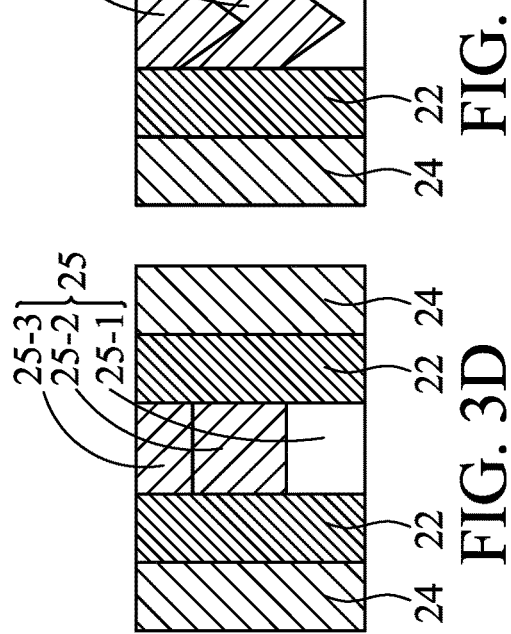
FIG. 3G

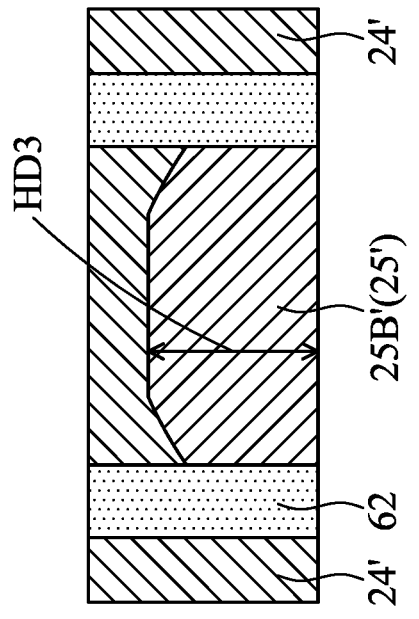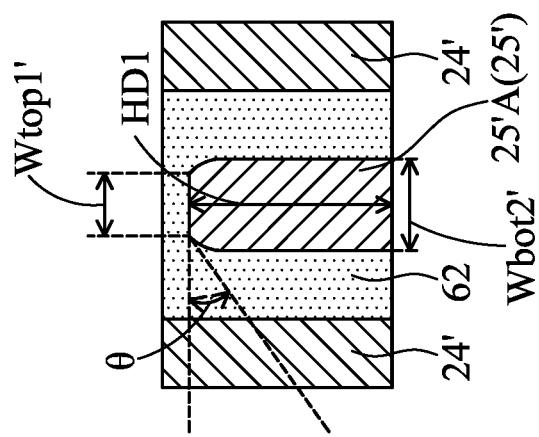
FIG. 20

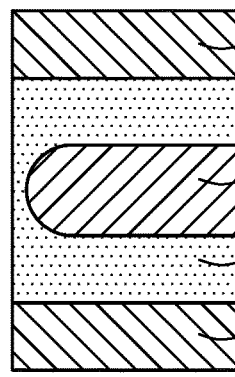
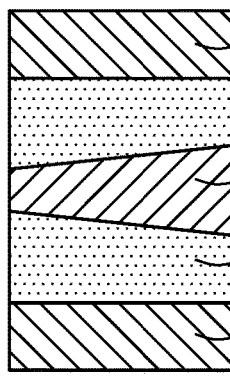
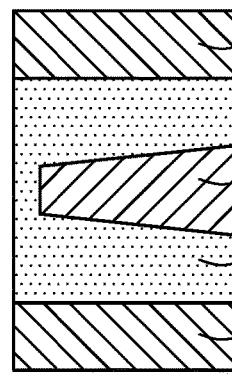
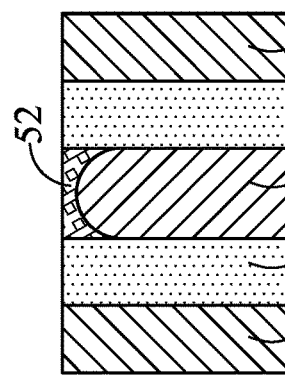
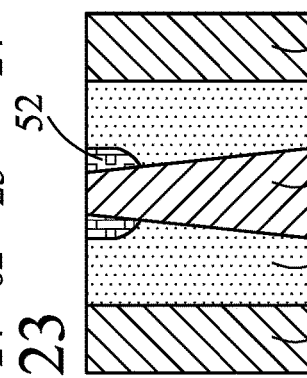
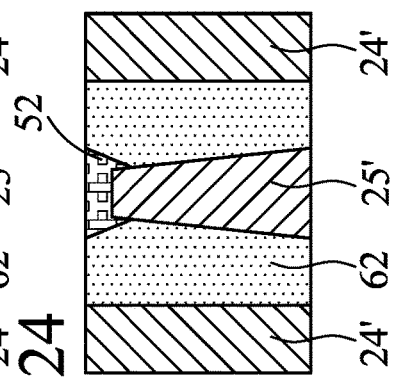
FIG. 23    FIG. 24    FIG. 25

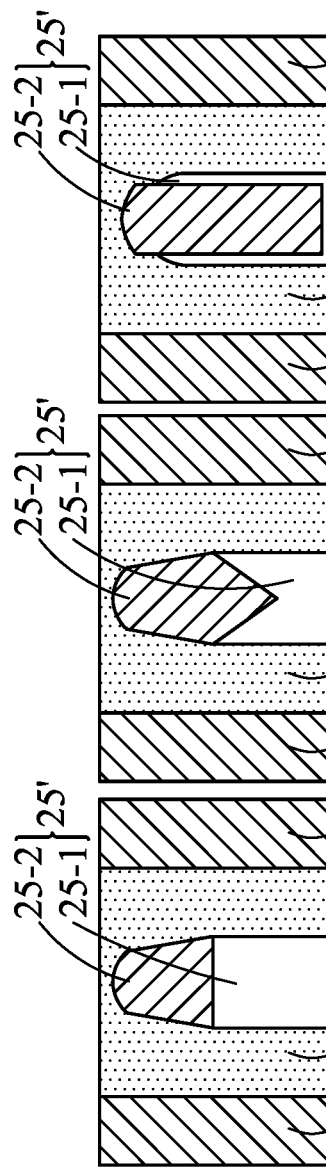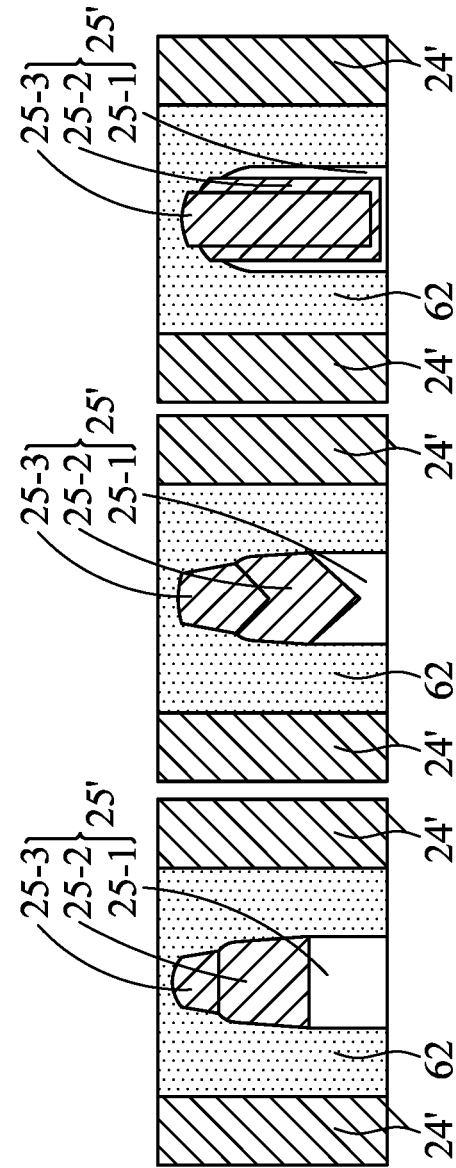

DUMMY FIN PROFILE CONTROL TO ENLARGE GATE PROCESS WINDOW

PRIORITY CLAIM AND CROSS-REFERENCE

This application claims the benefit of the U.S. Provisional Application No. 63/027,599, filed on May 20, 2020, and entitled "Dummy Gate Process Window Enlargement through Dummy Channel Profile Control;" which application is hereby incorporated herein by reference.

BACKGROUND

Metal-Oxide-Semiconductor (MOS) devices are basic building elements in integrated circuits. An existing MOS device typically has a gate electrode having polysilicon doped with p-type or n-type impurities, using doping operations such as ion implantation or thermal diffusion. The work function of the gate electrode was adjusted to the band-edge of the silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes or metal silicide gate electrodes, wherein the metallic gates used in NMOS devices and PMOS devices may also have band-edge work functions. Since the NMOS devices and PMOS devices have different requirements regarding the work functions, dual-gate CMOS devices are used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 3C, 3D, 3E, 3F, and 3G illustrate the cross-sectional views of dummy strips in accordance with some embodiments.

FIGS. 19A, 19B, and 20-31 illustrate the cross-sectional views of dielectric dummy fins in accordance with some embodiments.

DETAILED DESCRIPTION

Figure 1:
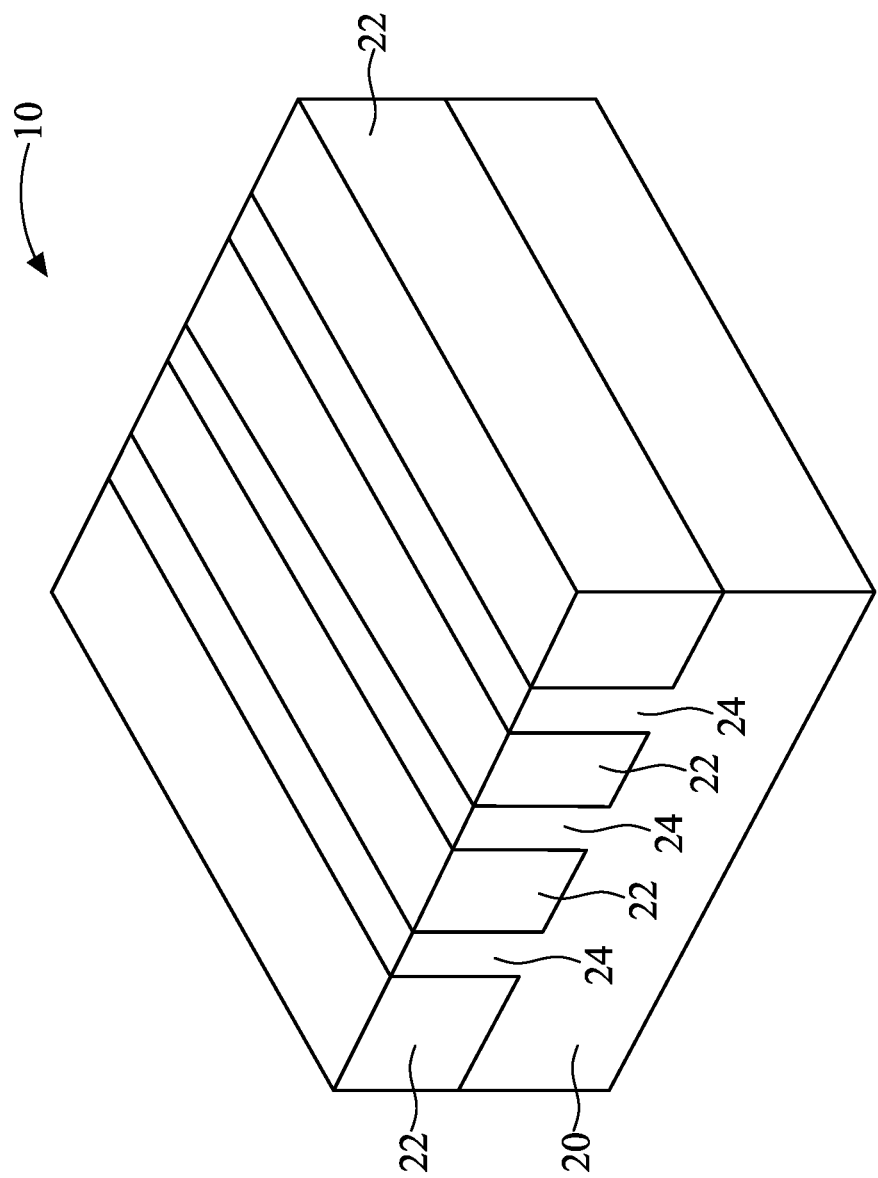
FIGS. 1-9, 10A, 10B, 11A, 11B, 12, 13A, 13B, 14, and 15 illustrate the cross-sectional views and the perspective views of intermediate stages in the formation of dielectric dummy fins, Fin Field-Effect Transistors (FinFETs), and gate isolation regions by cutting dummy gate stacks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) having dummy fins and gate isolation regions for separating the gate stacks of the FinFETs and the method of forming the same are provided in accordance with various embodiments. The intermediate stages in the formation of the dummy fins, gate isolation regions, and the corresponding FinFETs are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, the formation of a dummy fin include etching the dummy fin so that the top width of the dummy fin is reduced, which may be smaller than the corresponding bottom width. The reduction of the top width of the dummy fin reduces the difficulty in the patterning process for forming dummy gate stacks, and reduces the difficulty in the formation of replacement gate stacks. The corresponding process windows are thus enlarged.

FIGS. 1-9, 10A, 10B, 11A, 11B, 12, 13A, 13B, 14-17, 18A, and 18B illustrate the cross-sectional views and the perspective views of intermediate stages in the formation of dummy fins, Fin Field-Effect Transistors (FinFETs), and gate isolation regions in accordance with some embodiments. The corresponding processes are also reflected schematically in the process flow shown in FIG. 32.

Figure 32:
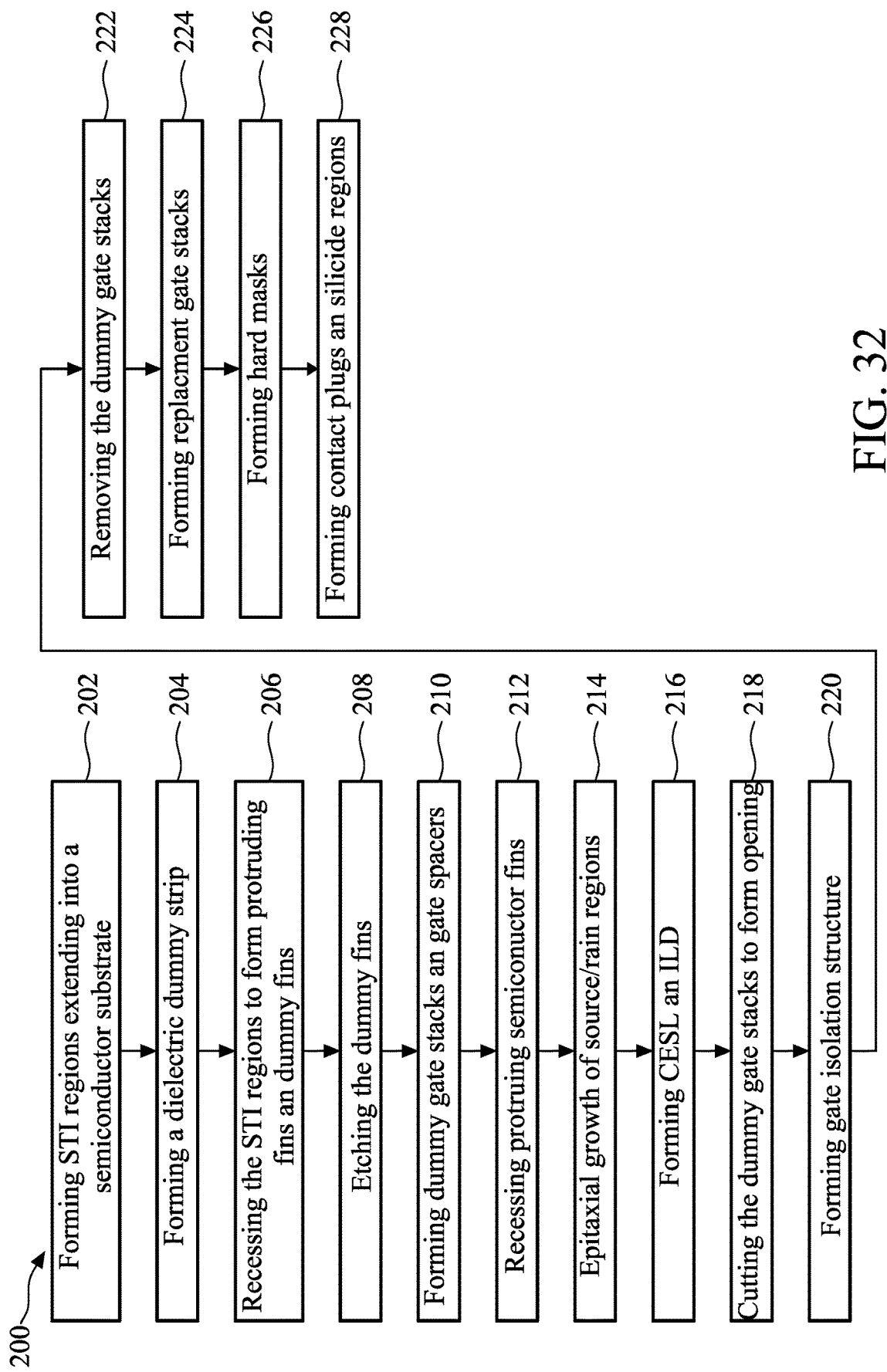
FIG. 32 illustrates a process flow for forming dielectric dummy fins, gate isolation regions, and FinFETs in accordance with some embodiments.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions are formed to extend from a top surface of substrate 20 into substrate 20. The respective process is illustrated as process 202 in the process flow 200 as shown in FIG. 32. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, SiC, SiPC, SiGe, SiGeB, Ge, or a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
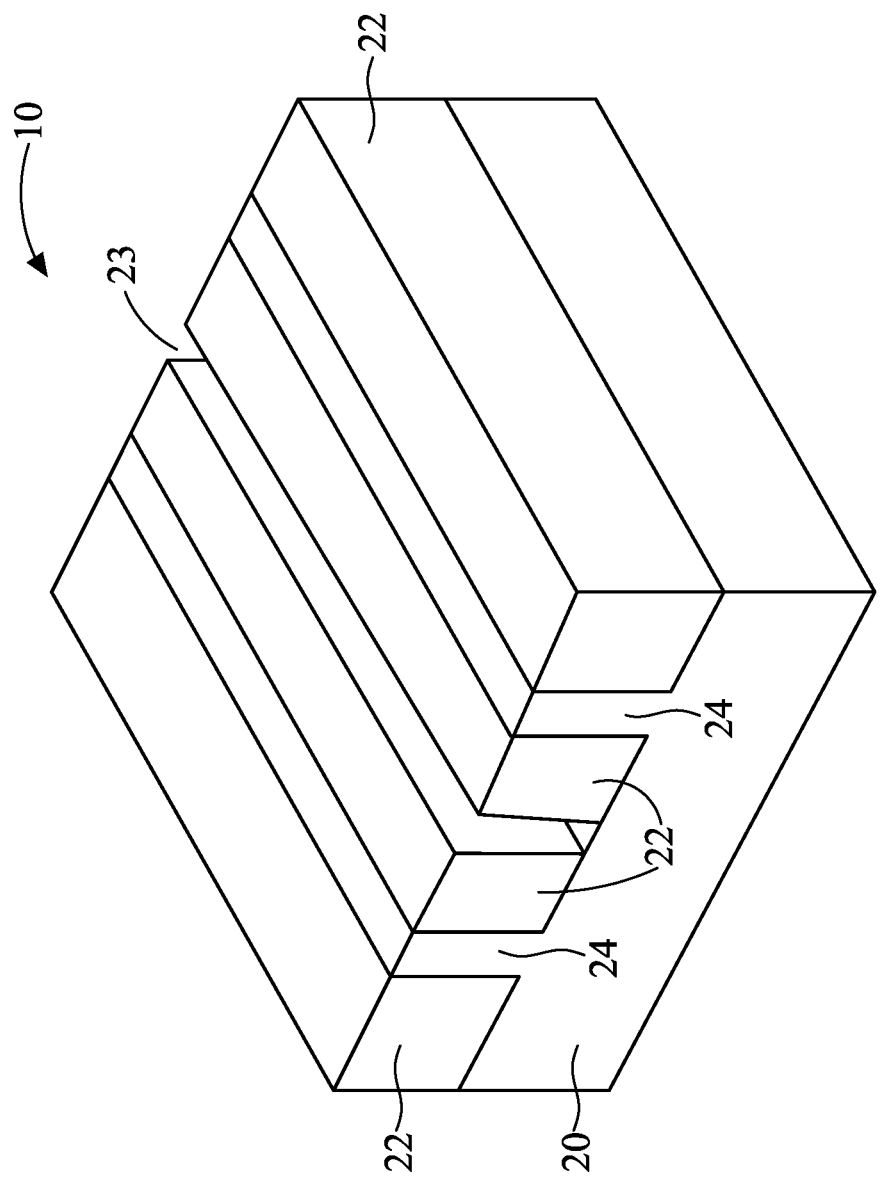
Figure 3:
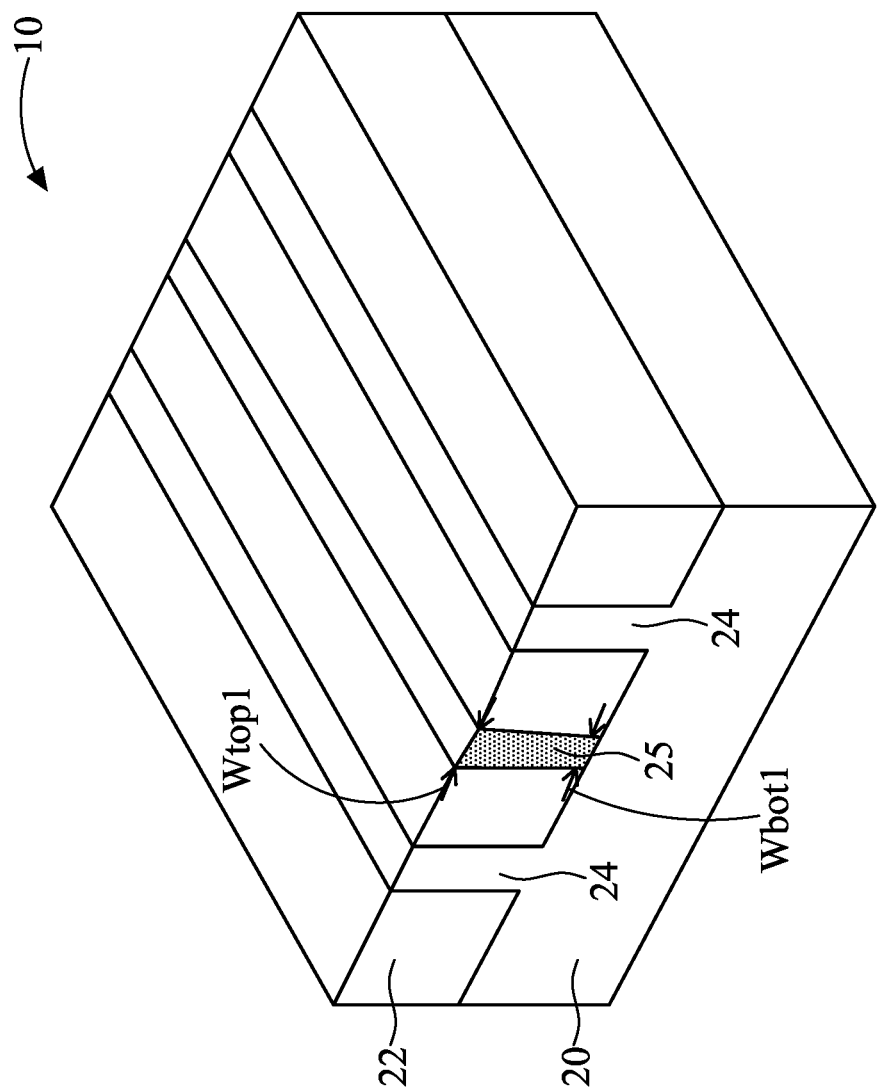

FIGS. 2 and 3 illustrate the formation of dielectric dummy strip 25 in accordance with some example embodiments. It is appreciated that dielectric dummy strip 25 may be formed using different methods. Referring to FIG. 2, a semiconductor strip 24 is recessed in an etching process, forming trench 23. The formation of trench 23 includes forming an etching mask (not shown) such as a photo resist to cover some portions of wafer 10, with the semiconductor strip 24 intended to be etched being exposed to the opening in the etching mask. The exposed semiconductor strip 24 is then etched to form trench 23. The bottom of trench 23 may be higher than or level with the bottom surfaces of STI regions 22.

FIG. 3 illustrates the formation of dielectric dummy strip 25, which includes filling the recess with a dielectric material, and performing a planarization process such as a Chemical Mechanical Polish (CMP) process or a mechanical grinding process. The respective process is illustrated as process 204 in the process flow 200 as shown in FIG. 32. In accordance with some embodiments of the present disclosure, the material of dummy strip 25 includes a silicon-based material such as SiN, SiON, SiOCN, SiC, SiOC, $SiO_2$, SiGe, or the like. In accordance with alternative embodiments of the present disclosure, the material of dummy strip 25 includes a metal-based material, which may be an oxide or a nitride of a metal, wherein the metal may include Ta, Hf, Cr, Al, Ni, Fe, Y, Cu, Sn, Co, or combinations thereof. The deposition process for forming dielectric dummy strip 25 may include ALD, Plasma-Enhanced Atomic Layer Deposition (PEALD), Physical Vapor Deposition (PVD), CVD, Plasma-Enhanced Chemical Vapor Deposition (PECVD), or the like. Dielectric dummy strip 25 may include a single or a plurality of sub-layers. Each of the sub-layers of dielectric dummy strip 25 may have a thickness in the range between about 3 Å and about 500 Å.

Dielectric dummy strip 25 may be a single-layer strip including a single layer, or may be a multi-layer strip including a plurality of sub-layers, for example, up to about 20 layers. Each sub-layer may have a thickness in the range between about 5 Å and about 500 Å. FIGS. 3A, 3B, 3C, 3D, 3E, 3F, and 3G illustrate the multi-layer dielectric dummy strip 25 in accordance with some embodiments. The sub-layers are illustrated as 25-1, 25-2, 25-3, etc. FIG. 3A illustrates a dielectric dummy strip 25 including sub layers 25-1 and 25-2, with the top surface of sub layer 25-1 being planar. FIG. 3B illustrates a dielectric dummy strip 25 including sub layers 25-1 and 25-2, with the top surfaces of sub layer 25-1 having an inversed pyramid shape with slant-and-straight sidewalls (or bottoms). The slant-and-straight sidewalls throughout the description, including what are shown in FIGS. 1B, 24, 25, and 27, and 30, are generated due to the etching of materials having slanted lattice planes. The formation of layer 25-1 may include depositing and planarizing layer 25-1, so that its top surface is coplanar with the top surface of STI regions 22, and then etching-back layer 25-1. FIG. 3C illustrates a dielectric dummy strip 25 including sub layers 25-1 and 25-2, with the sub layer 25-1 being conformal. FIGS. 3D, 3E, 3F, and 3G illustrate tri-layer dielectric dummy strips 25 in accordance with some embodiments, which include sub-layers 25-1, 25-2, and 25-3. In subsequent figures, the details of dielectric dummy strip 25, which may adopt any of these embodiments, are not illustrated.

Figure 4:
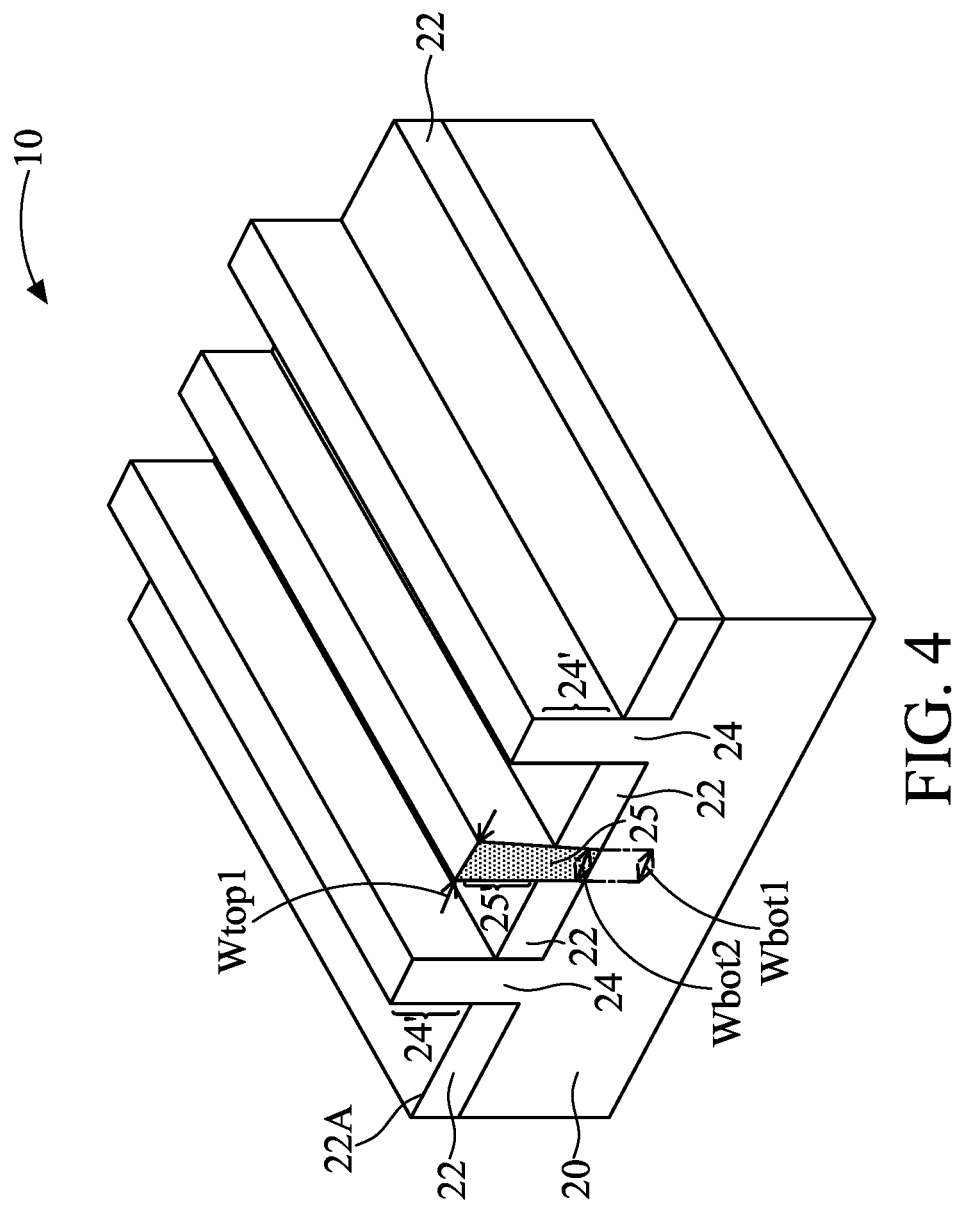

Referring to FIG. 4, STI regions 22 are recessed. The top portions of semiconductor strips 24 and dielectric dummy strip 25 protrude higher than the top surfaces 22A of the remaining portions of STI regions 22 to form protruding semiconductor fins 24' and dielectric dummy fin 25', respectively. The respective process is illustrated as process 206 in the process flow 200 as shown in FIG. 32. The etching may be performed using a dry etching process, wherein a mixture of $NF_3$ (or HF) and $NH_3$ is used as the etching gas. In accordance with alternative embodiments of the present disclosure, the recessing of STI regions 22 is performed through a wet etching process. The etching chemical may include HF solution, for example. In accordance with some embodiments, dielectric dummy strip 25 has top width Wtop1 and bottom width Wbot1. The top width Wtop1 may be greater than, equal to, or smaller than the bottom width Wbot1 of dielectric dummy strip 25, depending on the formation process. Dielectric dummy fin 25' also has bottom width Wbot2, which may be greater than, equal to, or smaller than, each of widths Wtop1 and Wbot1.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 5:
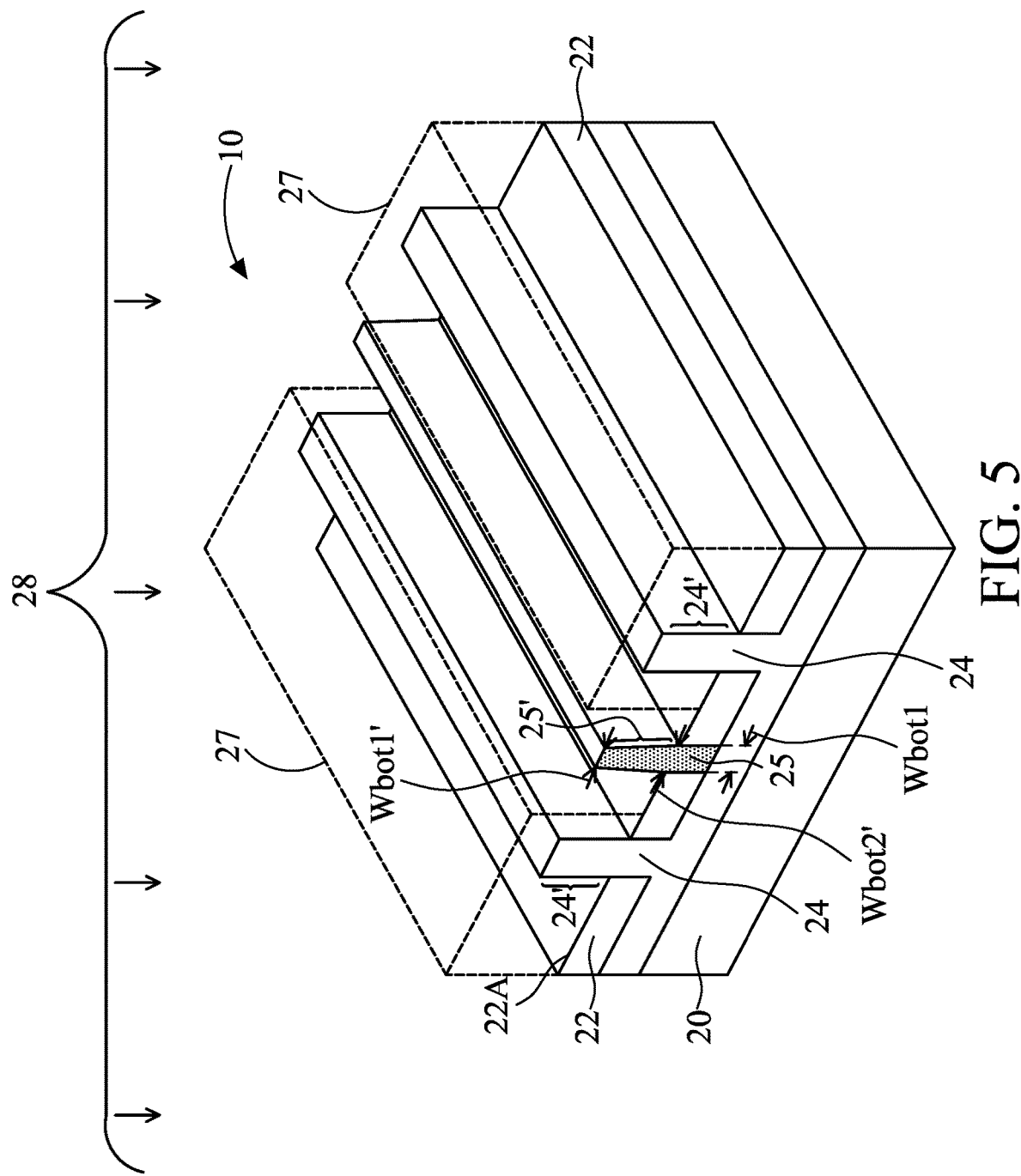

FIG. 5 illustrates the etching process 28 for etching and reducing the top width of dielectric dummy fin 25'. The respective process is illustrated as process 208 in the process flow 200 as shown in FIG. 32. In accordance with some embodiments, the etching process is a blanket etching process without using etching masks. Accordingly, an entirety top surface of wafer 10 is exposed to the etching chemical. In accordance with alternative embodiments, etching mask 27 is formed and patterned to protect the portions of the wafer 10 not intended to be etched. For example, as shown in FIG. 4, protruding semiconductor fins 24' are covered by etching mask 27. Etching mask 27 may include a photo resist, and may or may not include a hard mask formed of, for example, TiN, TaN, BN, or the like. Etching mask 27 is illustrated as dashed to indicate that it may or may not be formed. Adopting etching mask 27 incurs a higher cost, but may protect protruding fins 24'. The approach without adopting etching mask 27 has a lower cost, with the challenge of selecting appropriate etching chemical for preventing protruding fins 24' from being damaged.

Etching process 28 may include a dry etching process or a wet etching process. In accordance with some embodiments, the dry etching process is performed using direct plasma etching, remote plasma etching, radical etching, or the like. The etching gas may include a main etching gas and a passivation gas for adjusting etching selectivity, so that dummy dielectric fin 25' is etched, while other exposed features such as fins 24' and STI regions 22 are not etched. The main etching gas may include $Cl_2$, HBr, $CF_4$, $CHF_3$, $CH_2F_2$, $CH_3F$, $C_4F_6$, $BCl_3$, $SF_6$, $H_2$, $NF_3$, or the like, or combinations thereof. The passivation gas may include $N_2$, $O_2$, $CO_2$, $SO_2$, CO, $SiCl_4$, or the like, or combinations thereof. Also, a dilute (carrier) gas such as Ar, He, Ne, or combinations thereof may be added. The pressure of the etching gas may be in the range between about 1 mTorr and about 800 mTorr. The flow rate of the etching gas may be in the range between about 1 sccm and about 5,000 sccm. The etching process may be performed with a plasma source power in the range between about 10 watts and about 3,000 watts. A bias power may be, or may not be, applied, with the bias power being smaller than about 3,000 watts. The bias power may be used to control the plasma etch direction, with a higher bias power being used to achieve more anisotropic etching and reduce the height of dummy fin 25' more, and a lower (or no bias power) being applied to achieve more isotropic etching, so that the width (especially the top width) of dummy fin 25' is reduced more.

When the wet etching is performed, the respective chemical solution for the etching includes a main etching chemical for etching dummy fin 25' and an assisting etching chemical for adjusting the etching selectivity. The main etching chemical may include HF, $F_2$, or the like, or the combinations thereof. The assisting etching chemical may include $H_3PO_4$, $H_2SO_4$, HCl, HBr, $NH_3$, or combinations thereof. The solvent of the chemical solution includes de-ionized (DI) water, alcohol, acetone, or the like, or combinations thereof. After the etching process, etching mask 27, if formed, is removed.

As a result of etching process 28, the top width of dummy fin 25' is reduced. Since the aspect ratio of the trench between fins 24' and 25' may be high, the widths of upper portions of dummy fin 25' may be desirably reduced more than the widths of the respective lower portions. Dummy fin 25', after the etching process 28, may have top width Wtop1' and bottom width Wbot2'. Top width Wtop1' is smaller than bottom width Wbot2'. Furthermore, bottom width Wbot2' may be equal to or smaller than the bottom width Wbot2 (FIG. 4), and top width Wtop1' is smaller than the top width Wtop1 (FIG. 4). The top surface of dummy fin 25' may also be lowered. For example, prior to etching process 28, the top surface of dummy fin 25' may be coplanar with the top surfaces of protruding fins 24', while after etching process 28, the top surface of dummy fin 25' is lower than the top surfaces of protruding fins 24'. The height of dummy fin 25' may be reduced by height difference ΔH (FIG. 19B), which height difference may be greater than about 10 percent of the height of dummy fin 25'. More profiles of dummy fin 25' are discussed referring to FIGS. 19A, 19B, and FIGS. 20 through 31.

Figure 6:
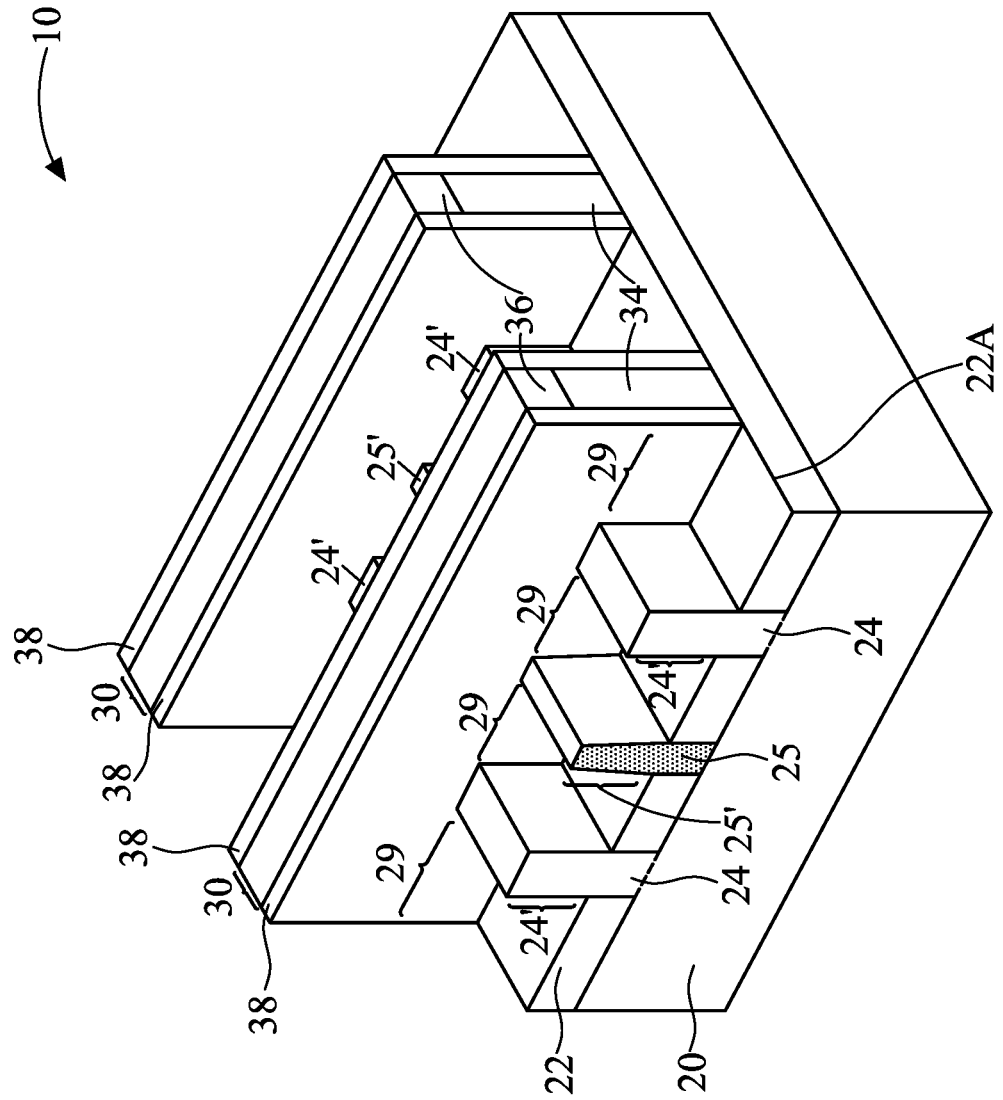

Referring to FIG. 6, dummy gate stacks 30 are formed on the top surfaces and the sidewalls of (protruding) fins 24' and 25'. The respective process is illustrated as process 210 in the process flow 200 as shown in FIG. 32. Dummy gate stacks 30 may include dummy gate dielectrics 32 (shown in FIG. 10B) and dummy gate electrodes 34 over dummy gate dielectrics 32. Dummy gate dielectrics 32 may be formed of silicon oxide, for example. Dummy gate electrodes 34 may be formed of or comprise, for example, polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or the like. Dummy gate stacks 30 also have lengthwise directions perpendicular to the lengthwise directions of protruding fins 24', and may cross over a single one or a plurality of protruding fins 24' and 25' and STI regions 22.

The formation of gate stacks 30 includes forming a gate dielectric layer(s), forming a blanket dummy gate electrode layer, planarizing the blanket dummy gate electrode layer, depositing a hard mask layer, and then patterning the deposited layers to form dummy gate stacks 30. In the patterning process, due to the increasingly greater aspect ratios of trenches 29 between protruding fins 24' and 25', it is increasingly more difficult to pattern the portions of the deposited layers in trenches 29. Accordingly, by reducing the top widths of dummy fin 25' (and possibly reducing the height of dummy fin 25'), the patterning of the portions of the deposited layers in trenches 29 is easier.

Next, gate spacers 38 are formed on the sidewalls of dummy gate stacks 30. The respective process is also illustrated as process 210 in the process flow 200 as shown in FIG. 32. In accordance with some embodiments of the present disclosure, gate spacers 38 are formed of a dielectric material such as silicon nitride, silicon oxide, silicon carbo-nitride, silicon oxy-nitride, silicon oxy-carbo-nitride, or the like, and may have a single-layer structure or a multi-layer structure including a plurality of dielectric layers.

Figure 7:
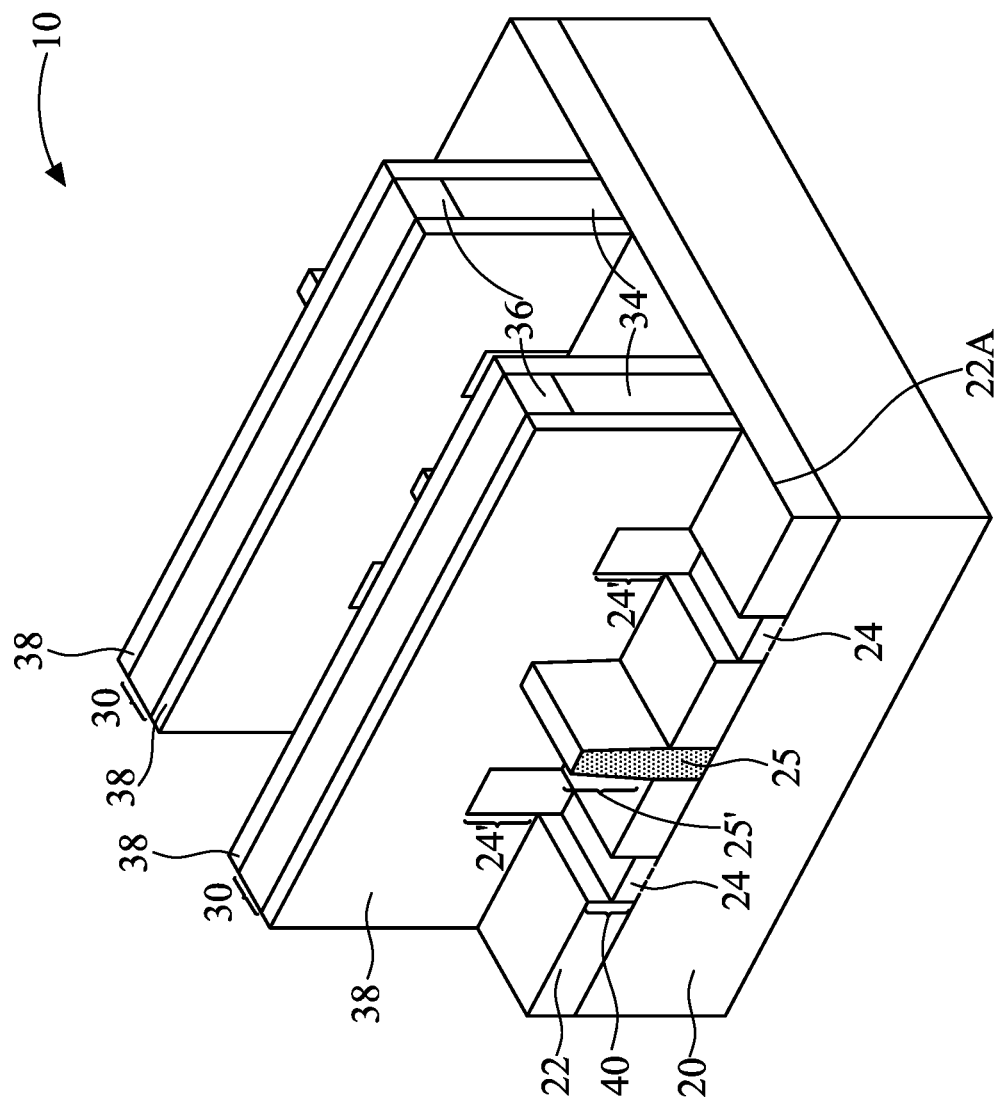

In a subsequent process, the portions of protruding fins 24' that are not covered by dummy gate stack 30 and gate spacers 38 are recessed in an etching process, resulting in the structure shown in FIG. 7. The respective process is illustrated as process 212 in the process flow 200 as shown in FIG. 32. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40. In the etching process, dielectric dummy fin 25' is not etched. For example, protruding fins 24' may be etched using $C_2F_6$, $CF_4$, $SO_2$, the mixture of HBr, $Cl_2$, and $O_2$, or the mixture of HBr, $Cl_2$, $O_2$, and $CF_2$ etc. when dry etching is adopted, KOH, tetramethylammonium hydroxide (TMAH), HF, or the like may be used.

Figure 8:
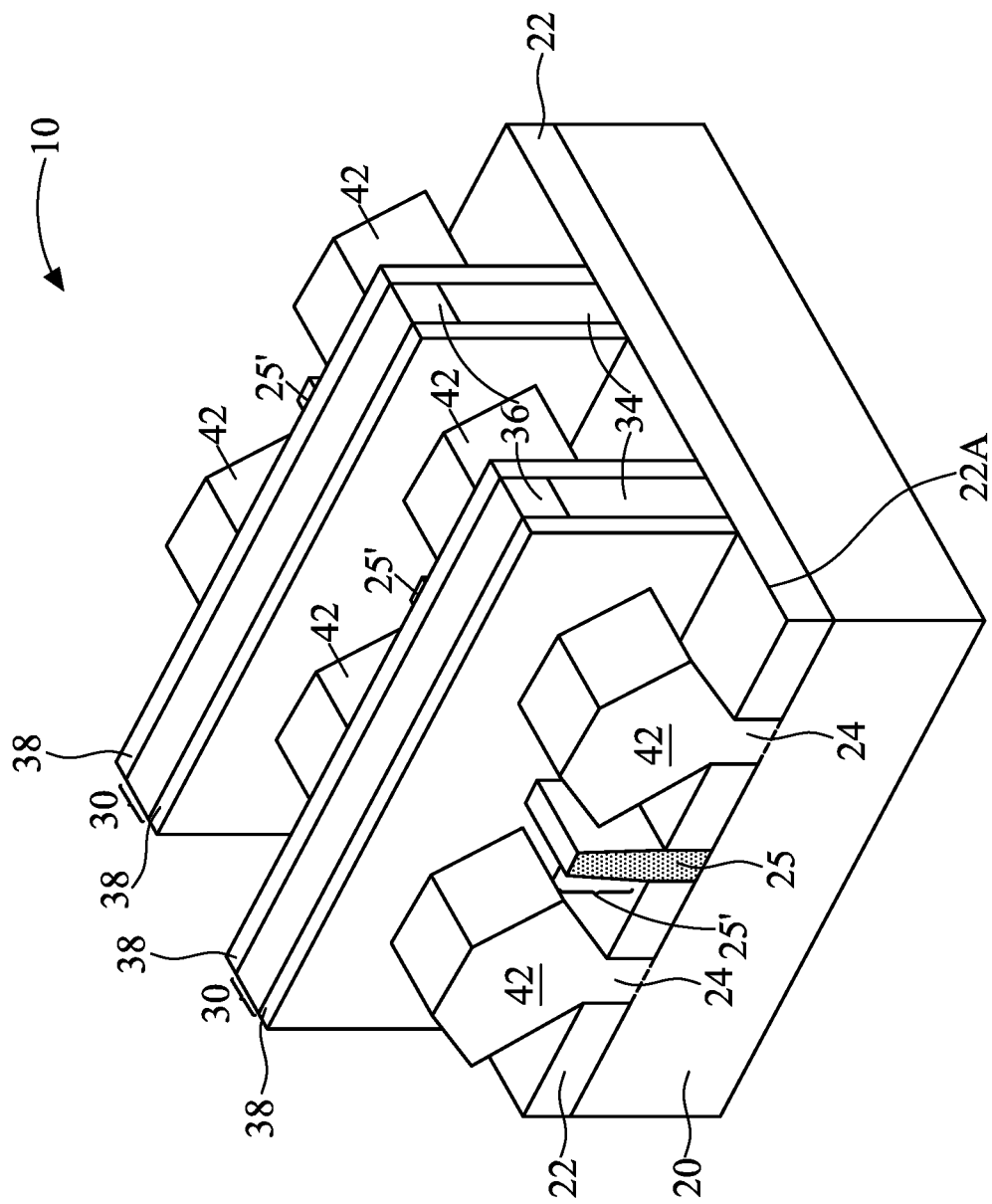

Next, epitaxy regions (source/drain regions) 42 are formed by selectively growing a semiconductor material from recesses 40, resulting in the structure in FIG. 8. The respective process is illustrated as process 214 in the process flow 200 as shown in FIG. 32. In accordance with some embodiments, epitaxy regions 42 include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. In accordance with alternative embodiments of the present disclosure, epitaxy regions 42 are formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

Figure 9:
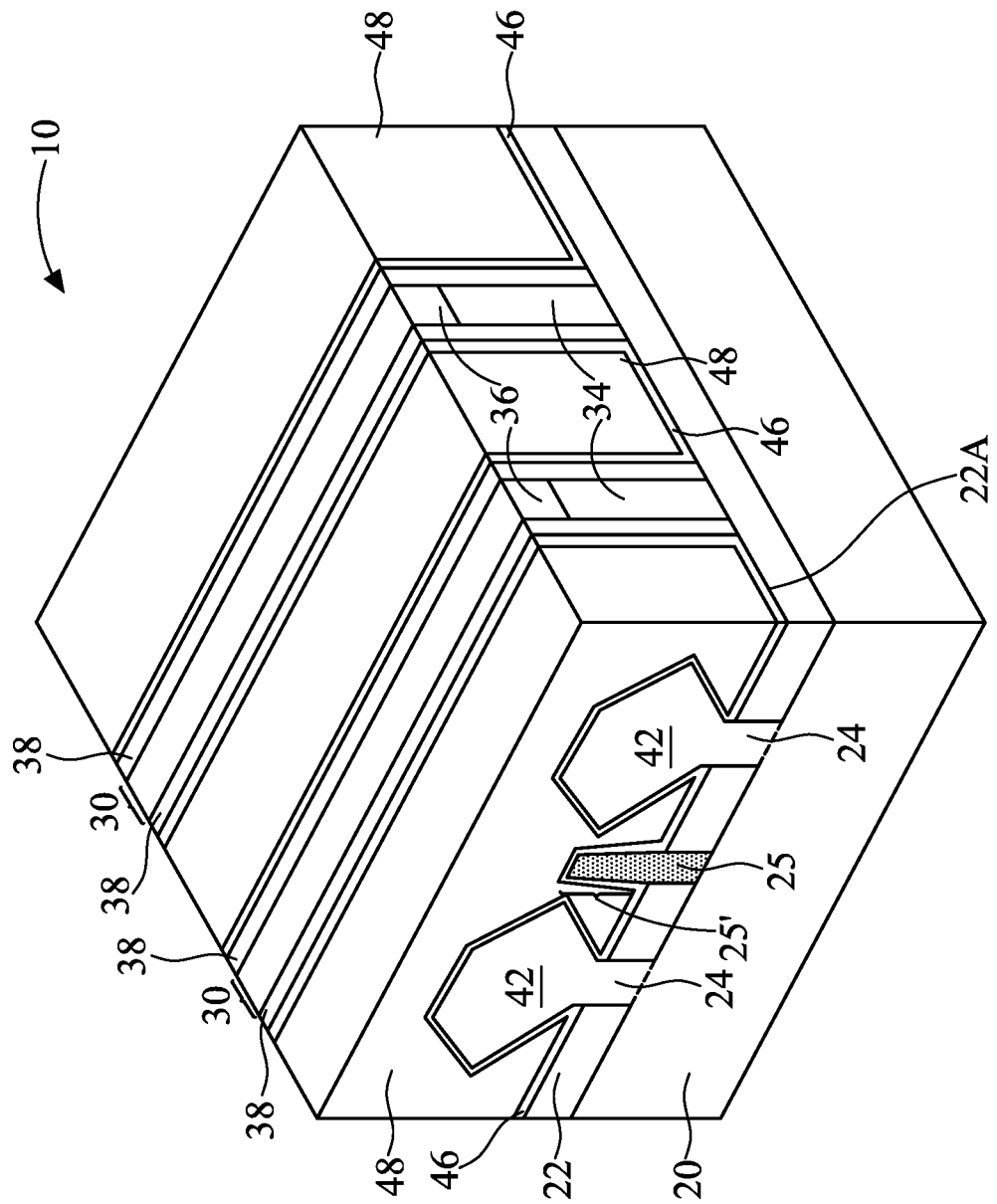

FIG. 9 illustrates a perspective view of the structure after the formation of Contact Etch Stop Layer (CESL) 46 and Inter-Layer Dielectric (ILD) 48. The respective process is illustrated as process 216 in the process flow 200 as shown in FIG. 32. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of or comprise an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process is performed to level the top surfaces of ILD 48, dummy gate stacks 30, and gate spacers 38 with each other. In accordance with some embodiments of the present disclosure, the planarization process stops on the top of hard mask 36. In accordance with alternative embodiments, hard mask 36 is also removed during the planarization process, and the planarization process stops on the top surface of dummy gate electrode 34. Accordingly, in some of subsequent figures, hard mask 36 is represented using a dashed line to indicate it may or may not exist.

FIGS. 10A, 10B, 11A and 11B illustrate the formation of gate isolation regions through a dummy-gate cutting process and a re-filling process in accordance with some embodiments of the present disclosure. In accordance with alternative embodiments, instead of cutting dummy gate stacks, replacement (metal) gate stacks are cut, and the corresponding processes are shown in FIGS. 16, 17, 18A and 18B.

Figure 10A:
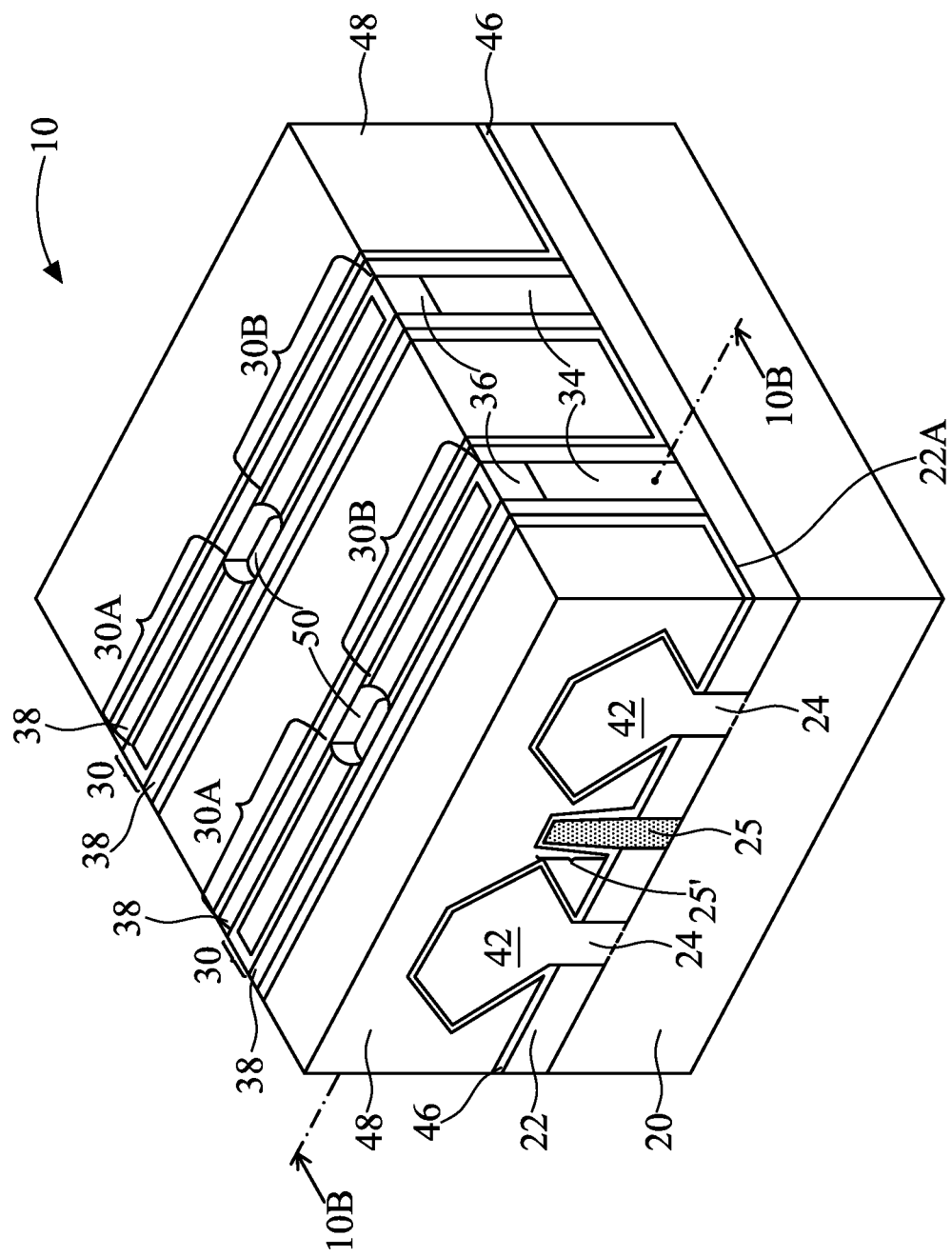

Referring to FIG. 10A, a dummy-gate cutting process is performed by etching dummy gate stacks 30 to form openings 50. The respective process is illustrated as process 218 in the process flow 200 as shown in FIG. 32. Dummy gate stacks 30 are thus separated into discrete portions. To perform the dummy-gate cutting process, an etching mask (not shown), which may include a photo resist, may be formed and patterned, so that the portions of dummy gate stacks 30 intended to be cut are exposed through the etching mask, while other portions are protected. Dummy gate stacks 30 are then etched in anisotropic processes, until the underlying dielectric dummy fin 25' is exposed. A long dummy gate stack 30 is thus cut into two discrete portions 30A and 30B that are disconnected from each other. Each discrete portion of dummy gate stack 30 may cross over one, two, or more protruding fins 24' in order to form a single-fin FinFET or a multi-fin FinFET. After the etching of dummy gate stack 30, the etching mask is removed, for example, in an ashing process.

Figure 10B:
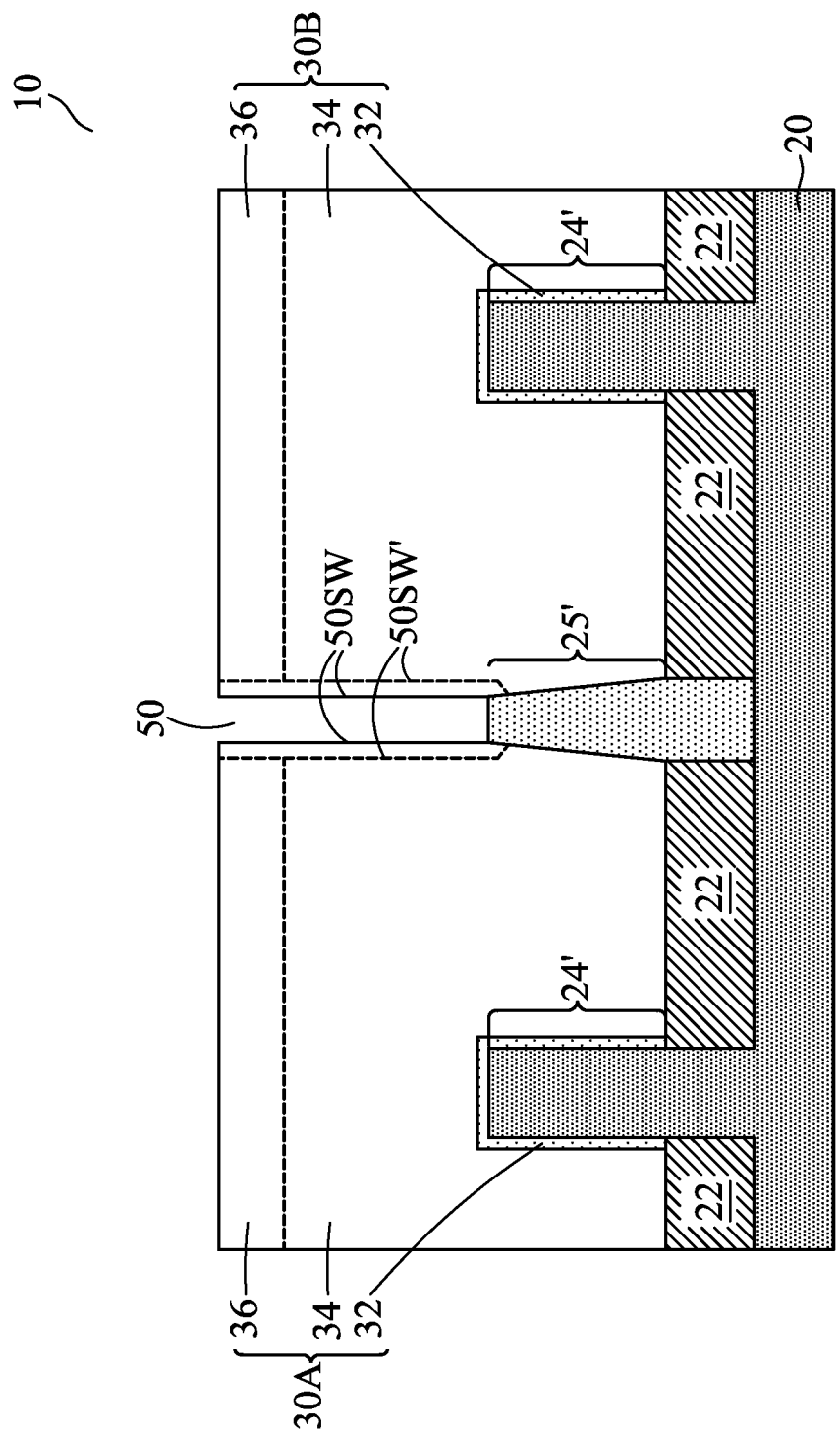

FIG. 10B illustrates a cross-sectional view obtained from the reference cross-section 10B-10B in FIG. 10A. Opening 50 extends to dummy fin 25', so that the portion 30A of dummy gate stack 30 is fully separated from the portion 30B of dummy gate stack 30. Opening 50 may be limited to the region directed over dielectric dummy fin 25', and the corresponding sidewalls of gate stack 30 facing opening 50 is illustrated as 50SW. Opening 50 may also extend laterally beyond the sidewalls of dielectric dummy fin 25', and the corresponding opening 50 may extend below the top surface of dielectric dummy fin 25', as shown by dashed lines representing sidewalls 50SW'.

Figure 11A:
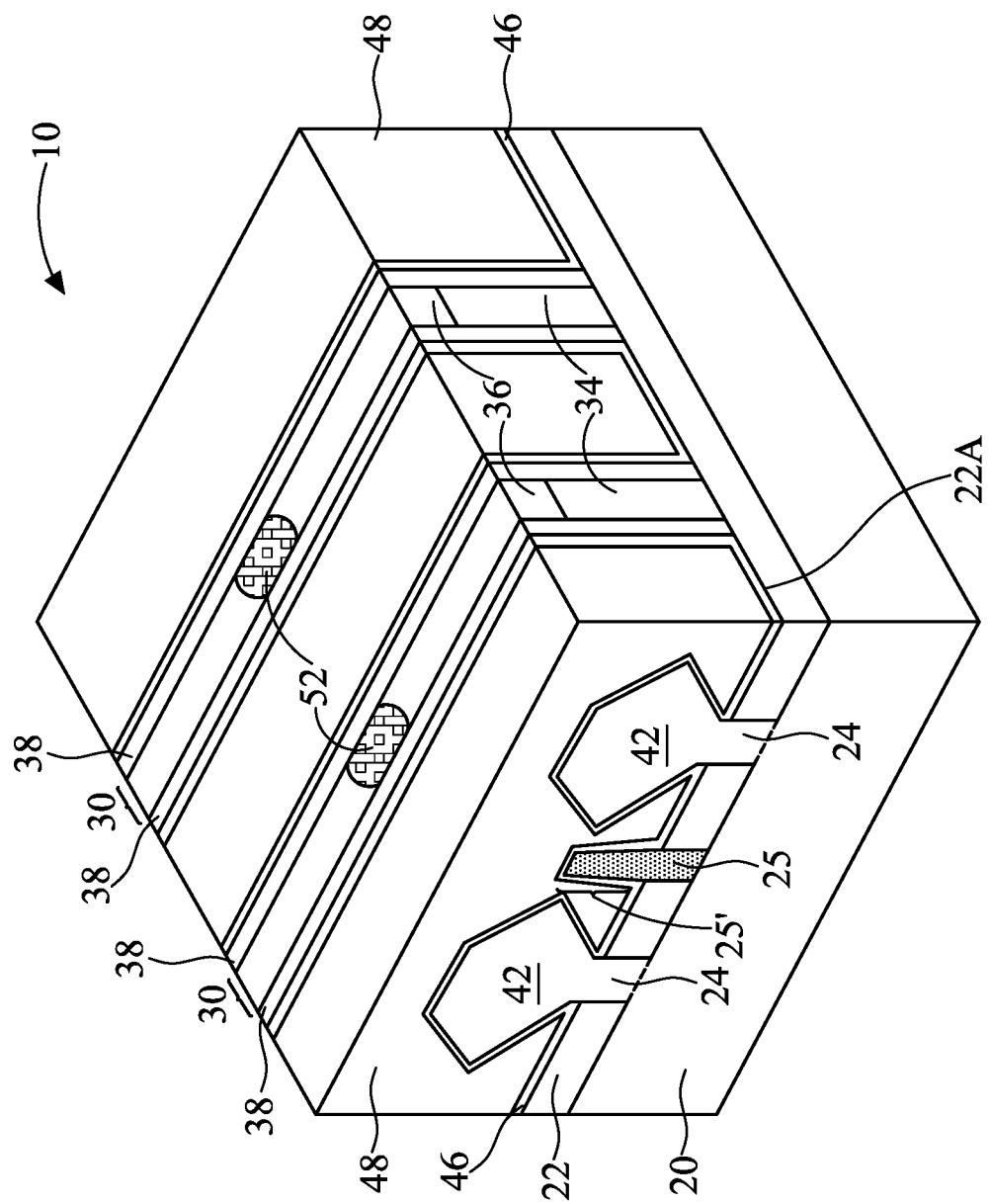
Figure 11B:
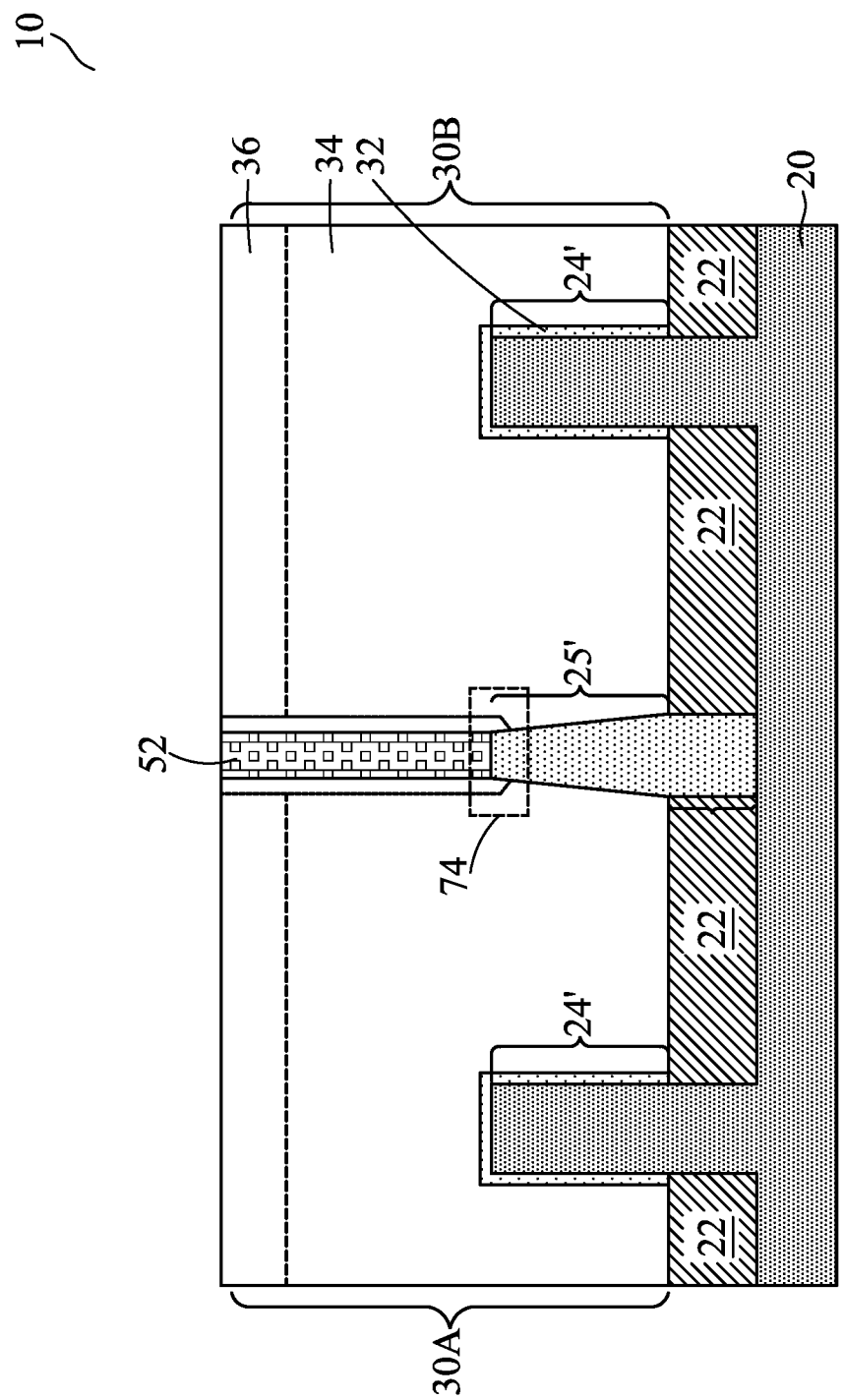

Next, gate isolation regions 52 are formed to fill openings 50. The respective process is illustrated as process 220 in the process flow 200 as shown in FIG. 32. The resulting structure is shown in FIGS. 11A and 11B. Each of gate isolation regions 52 may be a single-layer structure including one dielectric layer formed of a homogeneous material, or may have a multi-layer structure including a plurality of dielectric layers. The materials for forming gate isolation regions 52 may be selected from SiN, SiON, SiOCN, SiC, SiOC, $SiO_2$, or the like. The formation process may include depositing one or a plurality of dielectric layer(s), and then performing a planarization process such as a CMP process or a mechanical grinding process to remove excess portions of the dielectric material(s). Gate isolation regions 52 and the respective underlying dummy fin 25' separate the respective dummy gate stacks 30 into separate portions 30A and 30B. Gate isolation regions 52 and dummy gate stacks 30A and 30B in combination form elongated strips in the top view, and each of the elongated strips may be between a pair of opposing gate spacer 38.

Figure 12:
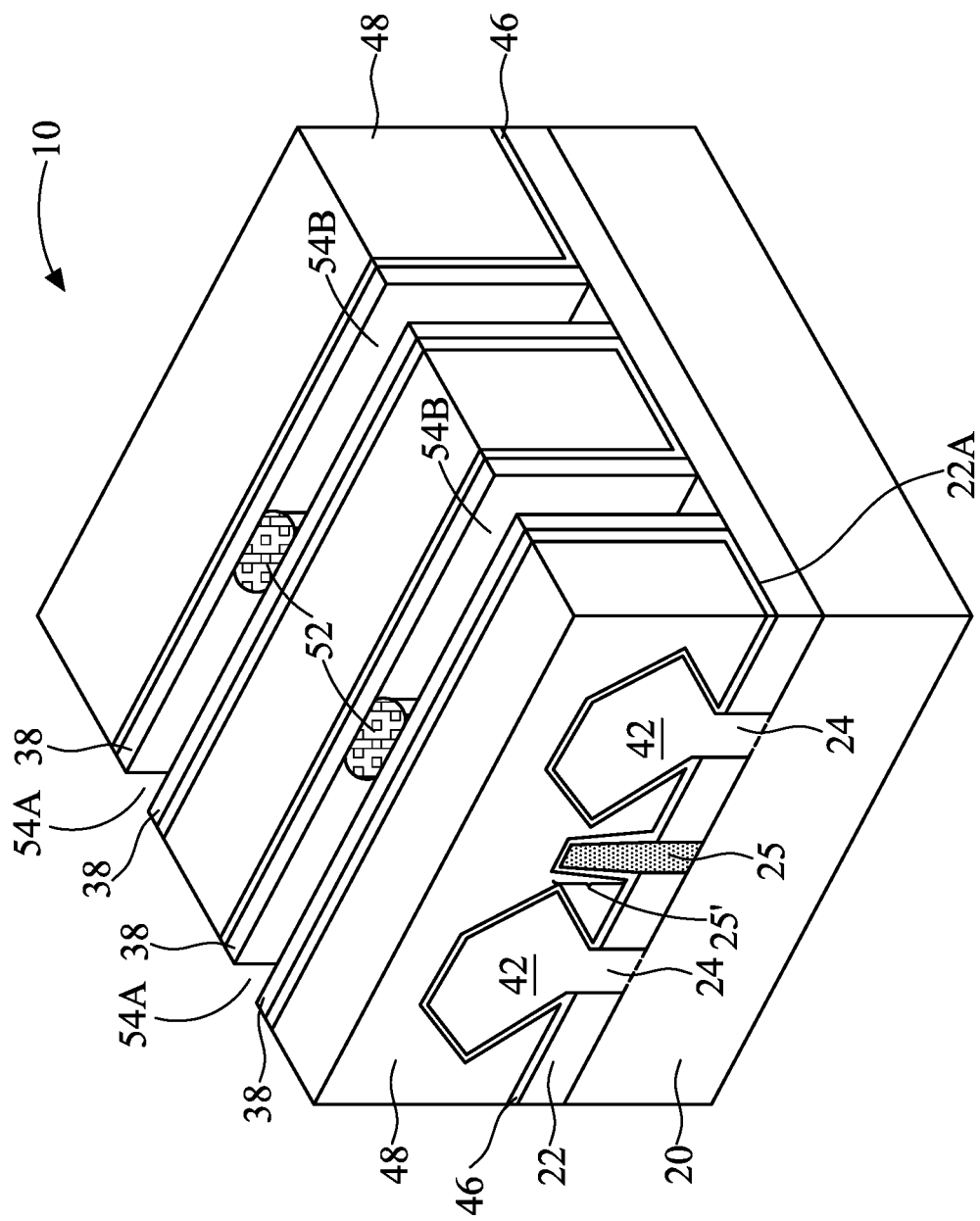

Dummy gate stacks 30A and 30B are then removed through etching, and the resulting structure is shown in FIG. 12. The respective process is illustrated as process 222 in the process flow 200 as shown in FIG. 32. Openings 54A and 54B are formed in the space left by the removed dummy gate stacks 30A and 30B, respectively. As shown in FIG. 12, each of openings 54A and 54B is defined by gate isolation region 52 and gate spacers 38, and openings 54A and 54B are further separated from each other by gate isolation region 52.

Figure 13A:
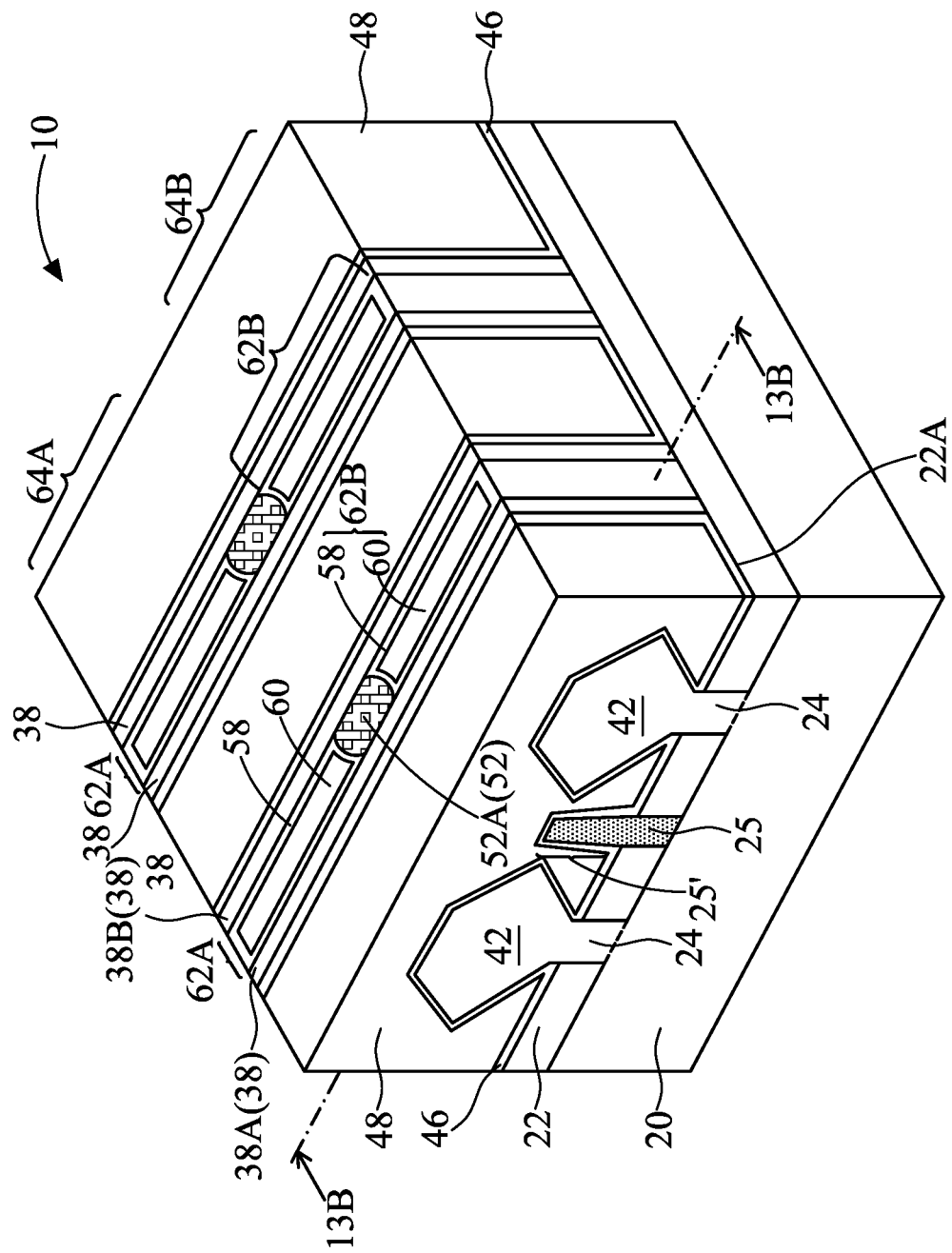
Figure 13B:
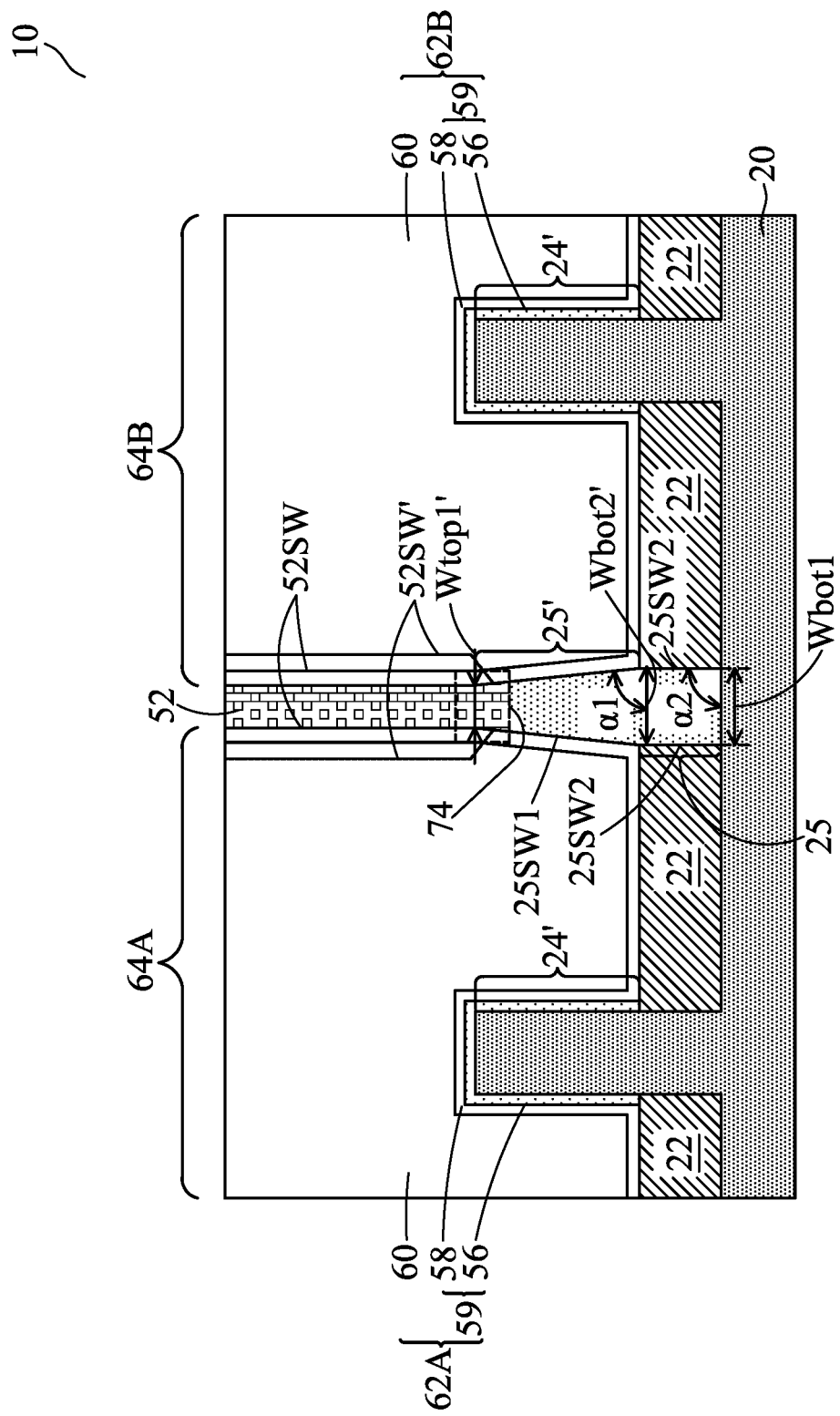

FIGS. 13A and 13B illustrate a perspective view and a cross-sectional view, respectively, in the formation of replacement gate stacks 62A and 62B. The respective process is illustrated as process 224 in the process flow 200 as shown in FIG. 32. FinFETs 64A and 64B are thus formed, with gate stacks 62A and 62B being the replacement gate stacks of FinFETs 64A and 64B, respectively. Replacement gates 62A and 62B may share common gate spacers 38A and 38B. Furthermore, both of replacement gates 62A and 62B abut the gate isolation region 52.

Replacement gate stacks 62A and 62B include gate dielectrics 59 (which include interfacial layers 56 and high-k dielectric layers 58, FIG. 13B) and gate electrodes 60. Interfacial layers 56 may be formed of or comprise silicon oxide, which may be formed through thermal oxidation or chemical oxidation. High-k dielectric layers 58 are formed of a high-k dielectric material(s) such as hafnium oxide, zirconium oxide, lanthanum oxide, or the like. In accordance with some embodiments of the present disclosure, gate electrodes 60 are formed of metals, metal alloys, metal nitrides, or the like, combinations thereof, and/or composite layers thereof. For example, gate electrodes 60 may have a composite structure including a plurality of layers formed of TiN, TiAl, TiAlC, TaN, Co, W, Al, and/or the like. The respective metals and the structure are selected so that the resulting replacement gate electrodes 60 have appropriate work functions. FIG. 13B illustrates a cross-sectional view obtained from the reference cross-section 13B-13B in FIG. 13A. The sidewalls of gate isolation region 52 are represented as 52SW or 52SW'.

As shown in FIG. 13B, dielectric dummy fin 25' has sidewalls 25SW1, and dielectric dummy strip 25 has sidewalls 25SW2. Sidewalls 25SW1 and 25SW2 may be straight or include straight portions, which have tilt angles $\alpha 1$ and $\alpha 2$, respectively. Tilt angle $\alpha 1$ is smaller than 90 degrees, and may be in the range between about 75 degrees and about 85 degrees. Tilt angle $\alpha 2$ may be greater than, equal, to, or smaller than 90 degrees. In accordance with some embodiments, tilt angle $\alpha 1$ is smaller than 90 degrees, and tilt angle $\alpha 2$ is greater than 90 degrees. Accordingly, the bottom width Wbot2' of dummy dielectric fin 25' may be greater than both of the top width Wtop1' and bottom width Wbot1 of dielectric dummy strip 25. Furthermore, in accordance with some example embodiments, from the top to the bottom of dummy dielectric fin 25', widths may continuously gradually and increase, while from the top to the bottom of dummy dielectric strip 25, widths may gradually and continuously reduce.

Figure 14:
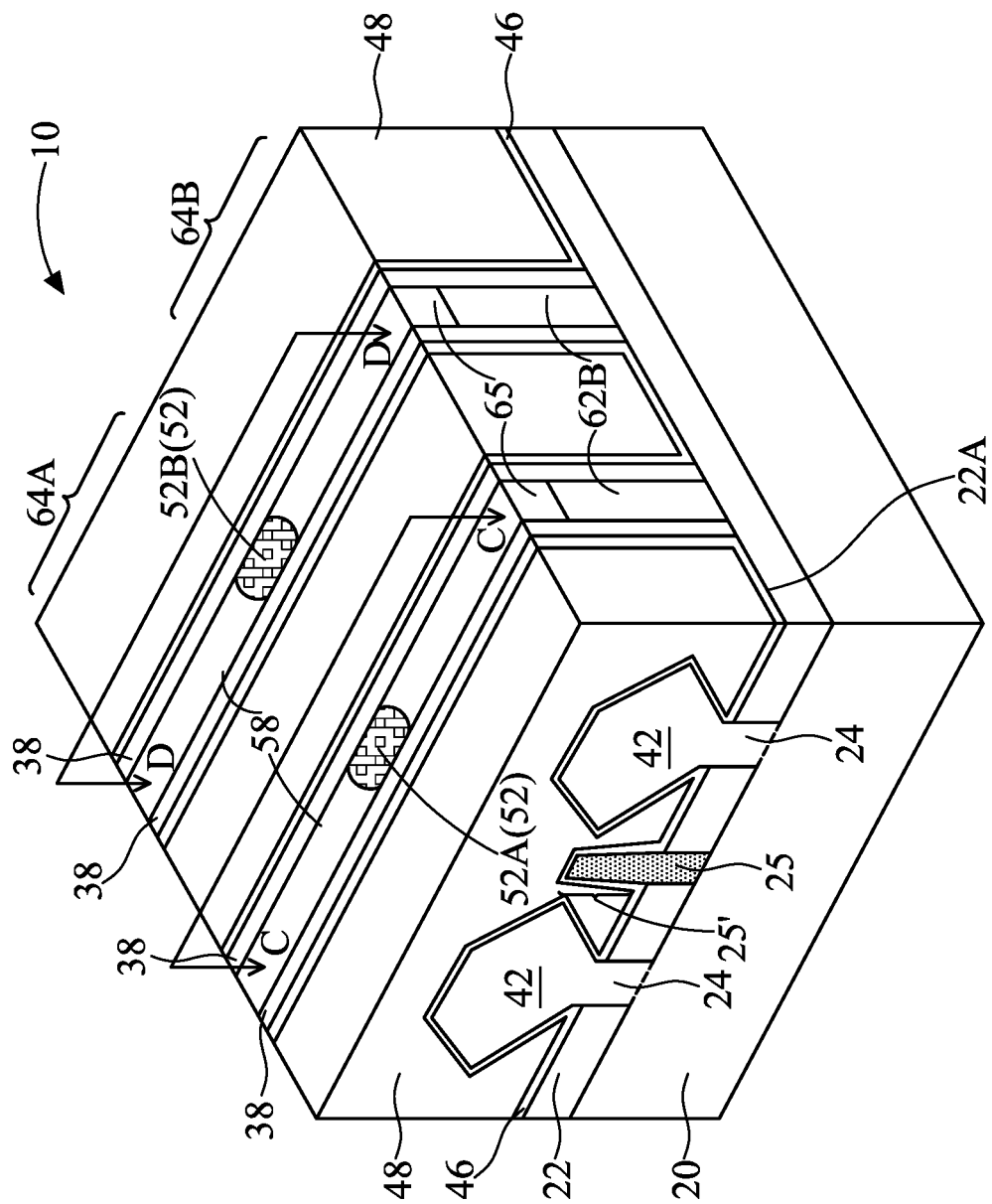

Referring to FIG. 14, in a subsequent process, replacement gate stacks 62A and 62B are etched back, resulting in recesses to be formed between opposite gate spacers 38. Next, hard masks 65 are formed over replacement gate stacks 62A and 62B. The respective process is illustrated as process 226 in the process flow 200 as shown in FIG. 32. In accordance with some embodiments of the present disclosure, the formation of hard masks 65 includes a deposition process to form a blanket dielectric material, and a planarization process to remove the excess dielectric material over gate spacers 38 and ILD 48. Hard masks 65 may be formed of silicon nitride, for example, or other like dielectric materials.

Figure 15:
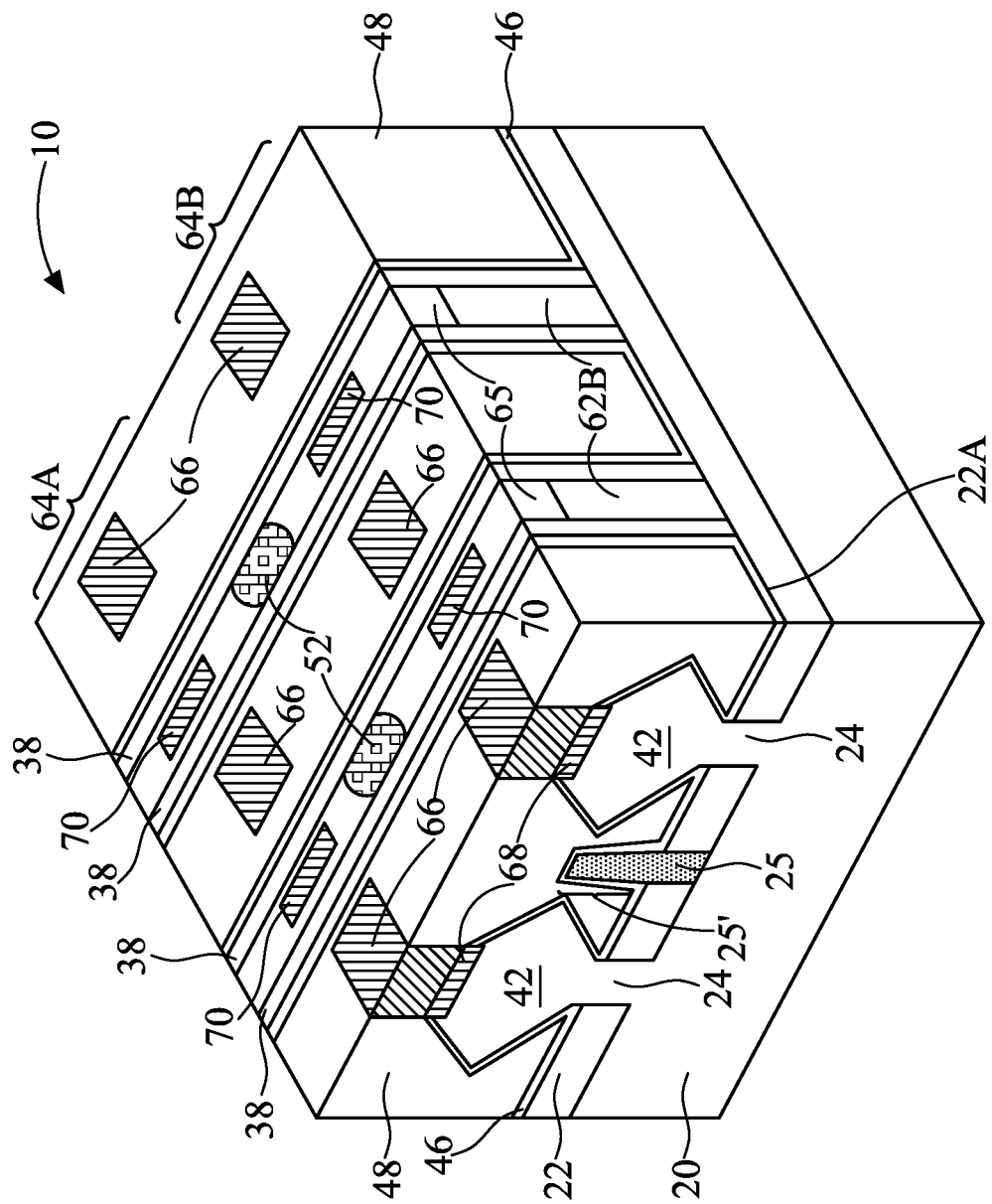
Figure 16:
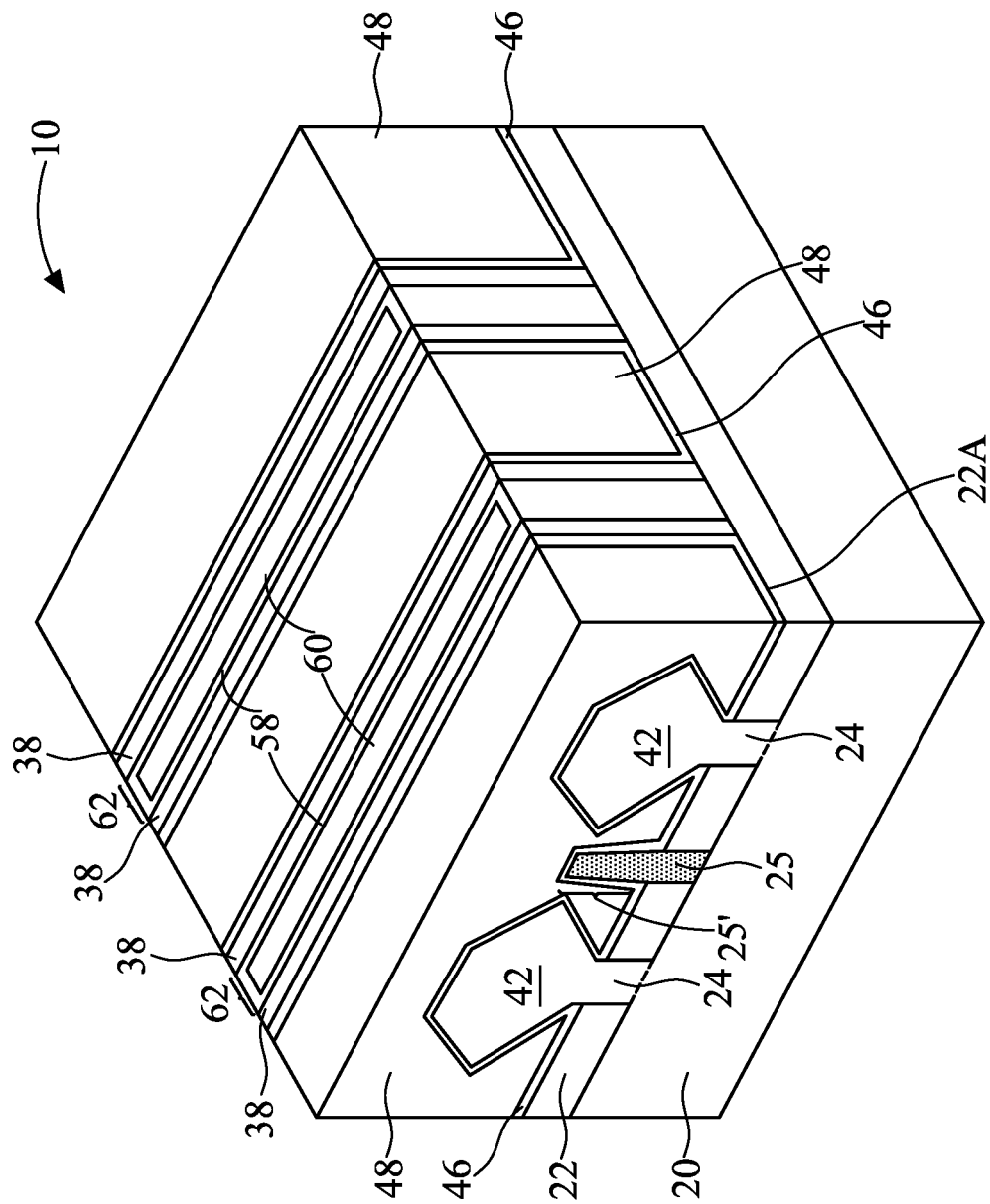
FIGS. 16, 17, 18A, and 18B illustrate the cross-sectional views and the perspective views in the formation of a gate isolation region by cutting replacement gate stacks in accordance with some embodiments.

FIG. 15 illustrates some of the features formed in subsequent processes, which may include source/drain contact plugs 66, source/drain silicide regions 68, and gate contact plugs 70. The respective process is illustrated as process 228 in the process flow 200 as shown in FIG. 32. The details of the processes are not discussed herein.

FIGS. 16, 17, 18A, and 18B illustrate the perspective views and cross-sectional views of intermediate stages in the cutting of replacement gate stacks and the formation of gate isolation regions in accordance with alternative embodiments of the present disclosure. Unless specified otherwise, the materials and the formation processes of the components in these embodiments are essentially the same as the like components, which are denoted by like reference numerals in the preceding embodiments shown in preceding figures. The details regarding the formation process and the materials of the components shown in FIGS. 16, 17, 18A, and 18B may thus be found in the discussion of the preceding embodiments.

The initial steps of these embodiments are essentially the same as shown in FIGS. 1 through 9. Next, without cutting the dummy gate stacks 30, the process proceeds to FIG. 16, in which replacement gate stack 62 is formed. The processes are essentially the same as shown in FIGS. 12 and 13A (except there is no gate isolation region formed). Next, referring to FIG. 17, replacement gate stacks 62 are cut in an etching process, which is performed through an anisotropic etching process. Openings 50 are thus formed to separate replacement gate stacks 62 into replacement gate stacks 62A and 62B. Dummy fin 25' is exposed to the overlying openings 50.

Figure 18A:
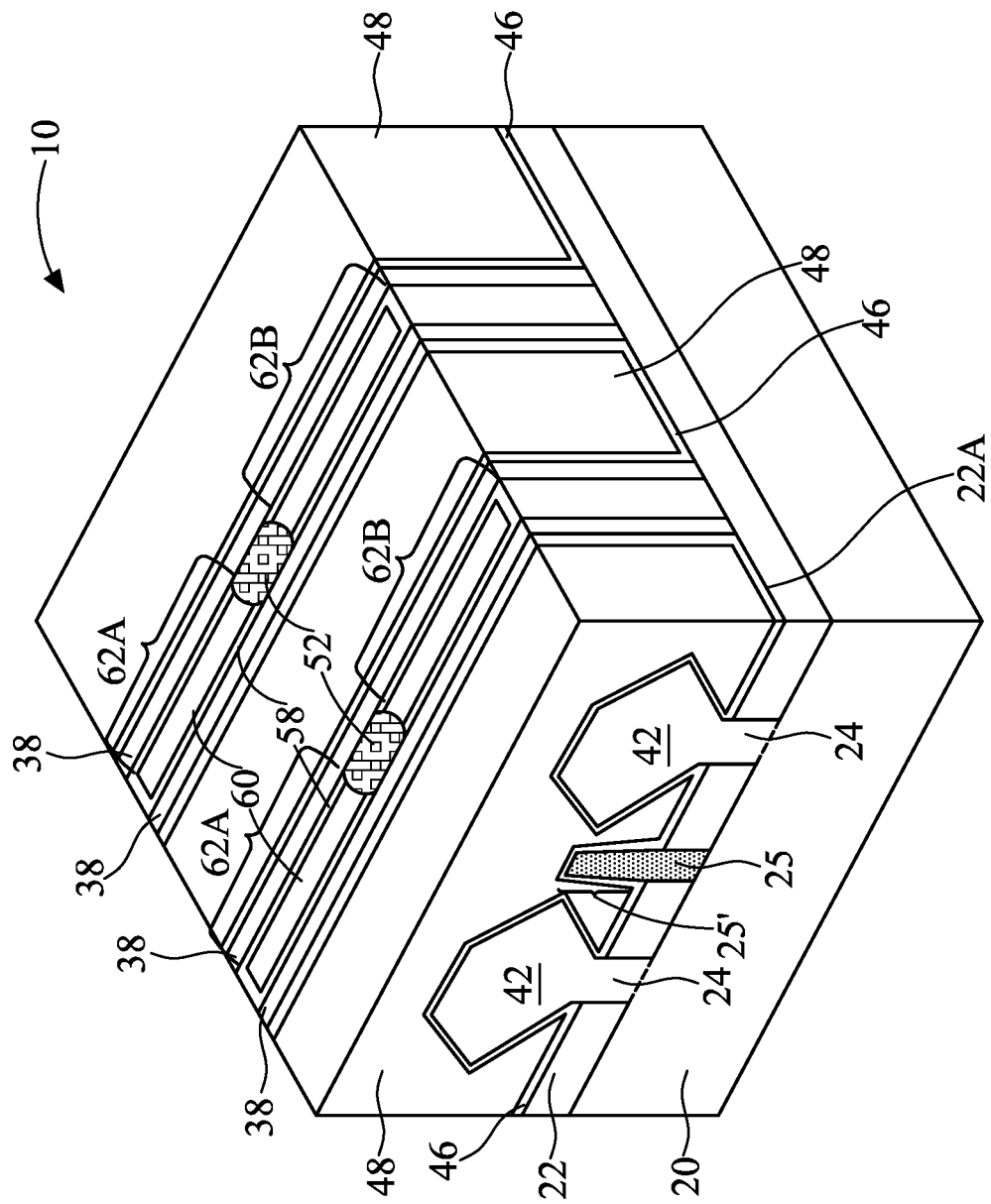
Figure 18B:
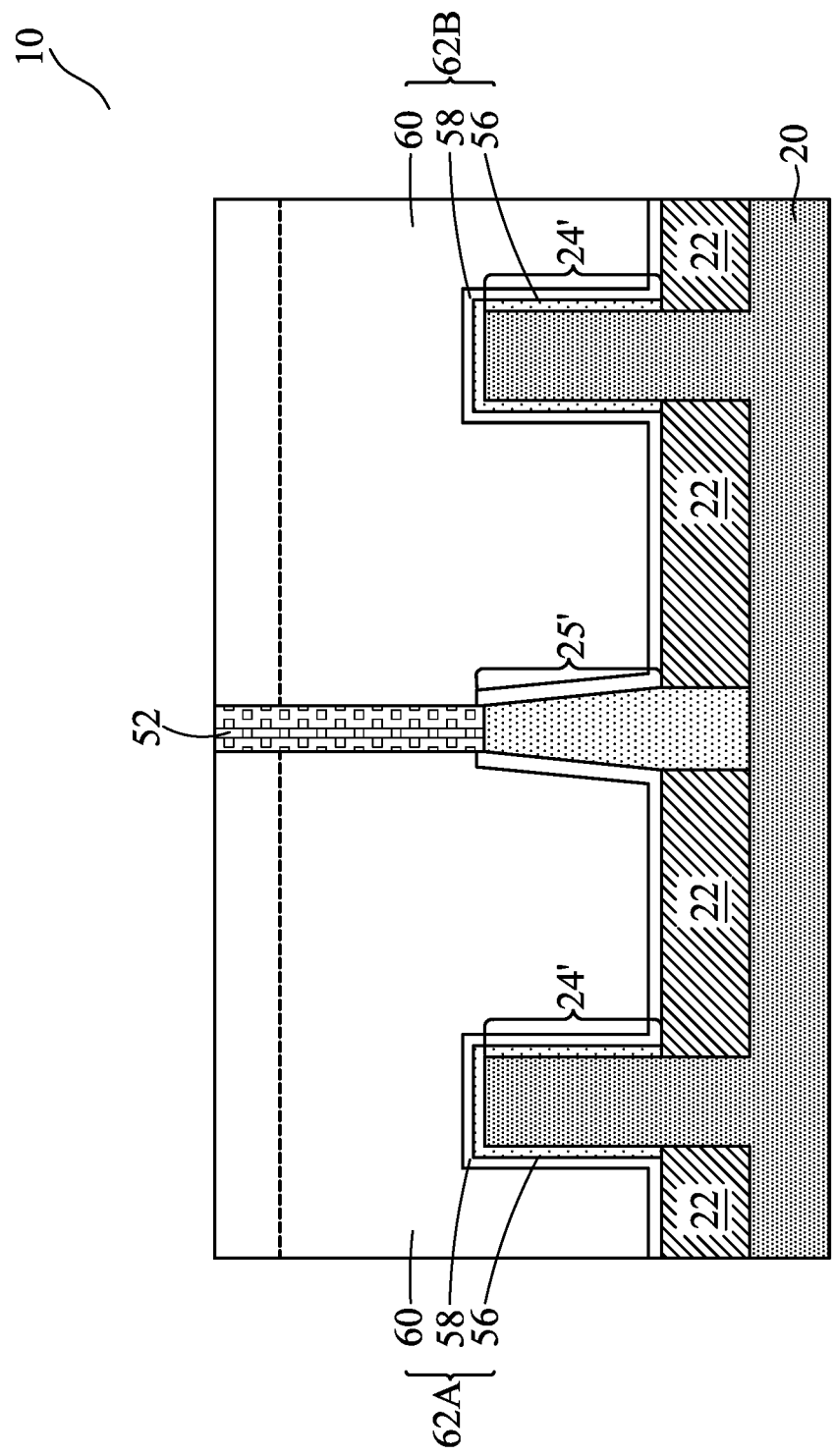

Next, as shown in FIGS. 18A and 18B, gate isolation regions 52 are formed. The formation process are essentially the same as discussed referring to FIGS. 10A, 10B, 11A, and 11B, and are not repeated herein. Subsequently, the processes as shown in FIGS. 14 and 15 are performed. The resulting structures are also illustrated in FIGS. 14 and 15.

Figure 17:
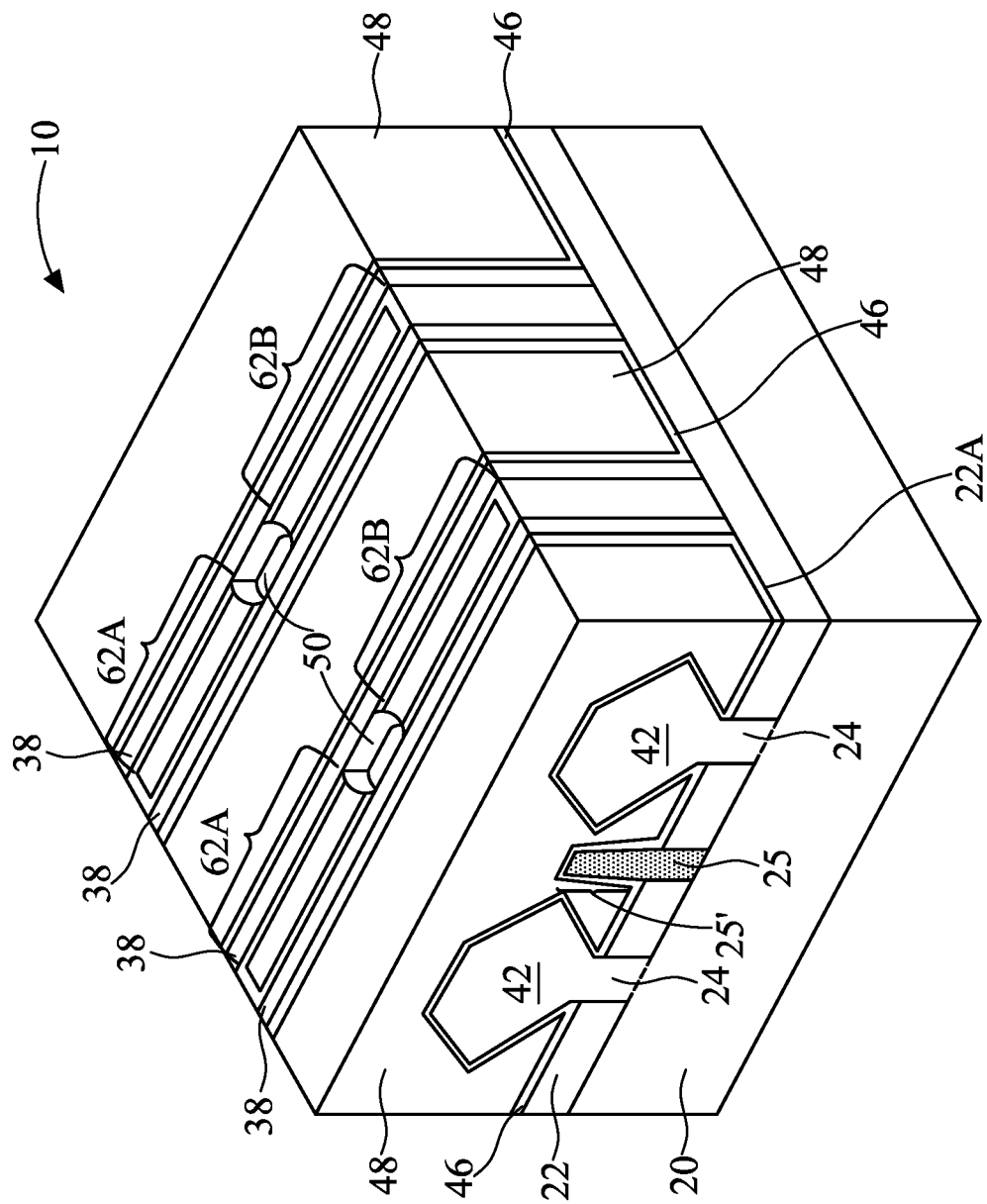

FIGS. 19A, 19B, and 20-31 illustrate some profiles of example dummy fins 25' and gate isolation regions 52 in accordance with some embodiments. It is appreciated that the features (such as replacement gate stacks 62 and protruding fins 24') in the neighborhood of dummy fins 25' and gate isolation regions 52 are shown schematically. The details of the neighboring features 62 and 24' may be realized by referring to FIGS. 13B and 18B. the profiles shown in FIGS. 19A, 19B, and 20-31 may be achieved by adjusting the process conditions in etching process 28 (FIG. 5) to change the top surface profile of dummy fins 25', and/or adjusting the etching process recipes for forming openings 50 (FIGS. 10A and 17).

Figure 19A:
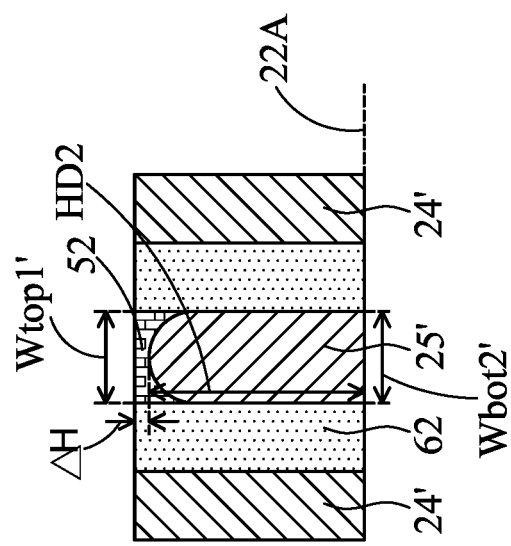
Figure 19B:
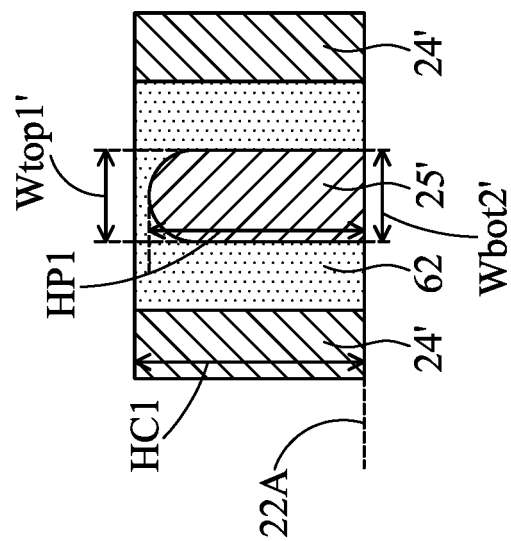

FIGS. 19A and 19B illustrate dummy fins 25' in accordance with some embodiments. FIG. 19A is obtained from a cross-section in which no gate isolation region is formed, and FIG. 19B is obtained from a cross-section in which a gate isolation region is formed. For example, assuming in FIG. 14, gate isolation region 52A is formed, while gate isolation region 52B is not formed, the cross section shown in FIG. 19A is obtained from reference cross section D-D in FIG. 14, and the cross section shown in FIG. 19B is obtained from reference cross section C-C in FIG. 14A. In FIGS. 19A and 19B, dummy fin 25' may have a rounded top surface, and straight sidewalls connecting to the rounded top surface. The top width Wtop1' may be measured at the top end of the straight sidewalls, or measured as the width of a planar top surface as shown in FIG. 20. The bottom width Wbot2' is measured at the top surface level 22A of STI regions 22 (not shown in FIGS. 19A and 19B, refer to FIG. 5). Top width Wtop1' is smaller than bottom width Wbot2'. In accordance with some embodiments, both of top width Wtop1' and bottom width Wbot2' are in the range between about 5 Å and about 5,000 Å. Furthermore, the difference (Wbot2'−Wtop1') may be greater than about 20 Å, and may be in the range between about 20 Å and about 1,000 Å. The ratio Wtop1'/Wbot2' may be in the range between about 0.5 and about 0.95.

In FIGS. 19A and 19B, the height of protruding fin 24' is HC1, the height of dummy fin 25' in FIG. 19A is HD1, and the height of dummy fin 25' in FIG. 19B is HD2. Height HC1 may be greater than or equal to height HD1, and may be greater than or equal to height HD2. In accordance with some embodiments, heights HC1, HD1, and HD2 are in the range between about 100 Å and about 3,000 Å. In accordance with some embodiments, the height difference ΔH, which is equal to (HC1−HD2) is greater than about 3 Å, and may be in the range between about 3 Å and about 2500 Å. The ratio ΔH/HC1 may be in the range between about 0.03 and about 0.8.

FIG. 20 illustrates a dummy fin 25', which has a planar top surface, vertical sidewalls, and curved top surfaces connecting the planar top surface to the vertical sidewalls. In accordance with some embodiments, both of top width Wtop1' and bottom width Wbot2' are in the range between about 20 Å and about 5,000 Å. The difference (Wbot2'−Wtop1') may be greater than about 20 Å, and may be in the range between about 20 Å and about 1,000 Å. Tilt angle θ, which is formed between the planar top surface and the tangent line of the curved top surface, is in the range between about 30 degrees and about 88 degrees.

Furthermore, there may be some narrow dummy fins 25' (denoted as 25A') and wide dummy fins (denoted as 25B'). The width of wide fin 25B' may be 1.5 times or more of the width of narrow fin 25A' in accordance with some embodiments. Due to the nature of etching, wide dummy fin 25B' is etched faster than the narrow dummy fin 25A'. Accordingly, height HD3 of wide dummy fin 25B' is smaller than the height HD1 of narrow dummy fin 25A'.

Figure 21:
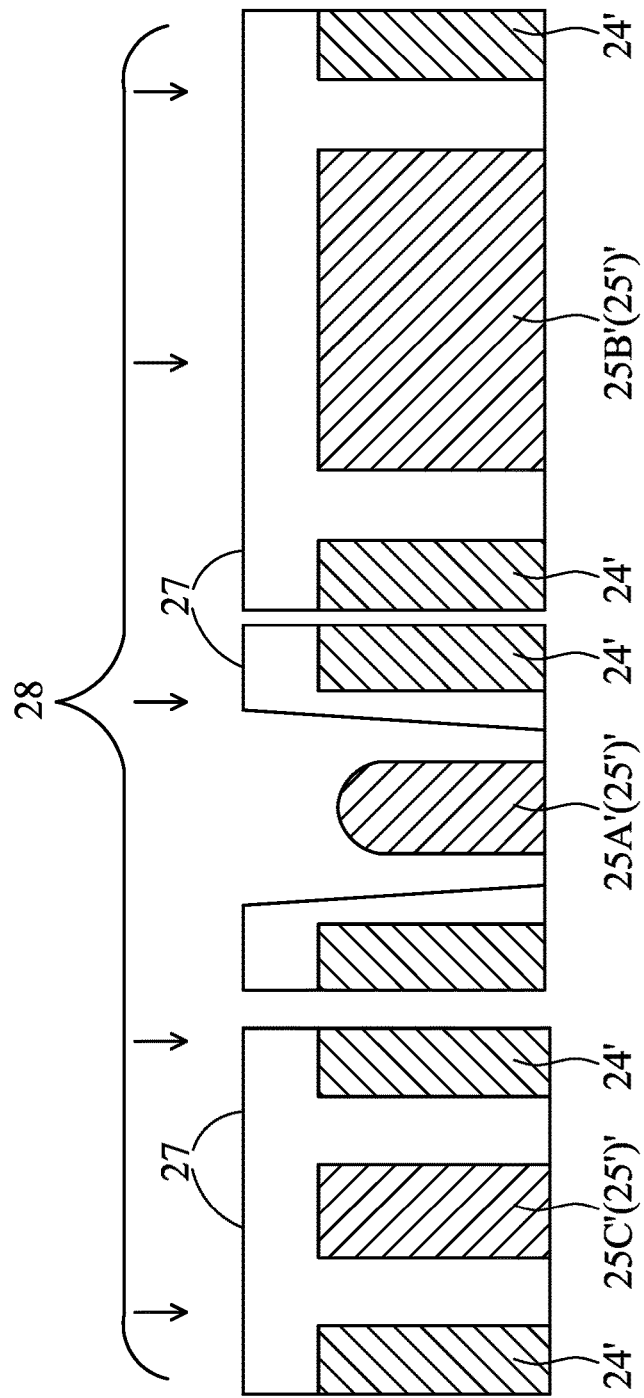
Figure 22:
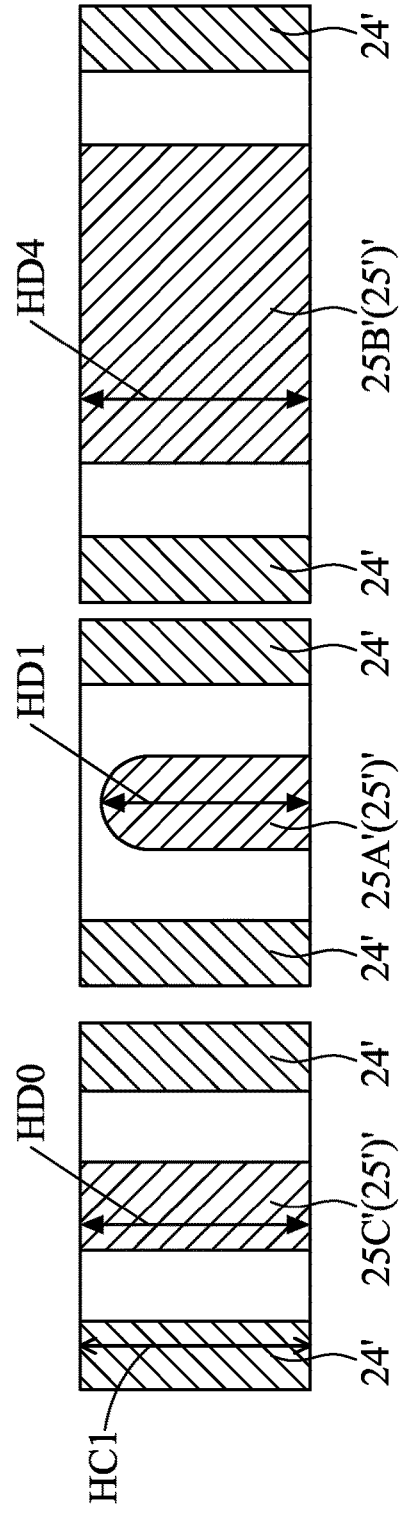

FIGS. 21 and 22 illustrate the formation of narrow dummy fins 25A' and 25C', and wide dummy fin 25B' in accordance with some embodiments. Referring to FIG. 21, etching mask 27 is formed and patterned, so that narrow dummy fin 25A' is exposed, while narrow dummy fin 25C' and wide dummy fin 25B' are protected. Etching process 28 (refer to FIG. 5) is performed to etch narrow dummy fin 25A', while narrow dummy fin 25C' and wide dummy fin 25B' are not etched. The resulting dummy fins are shown in FIG. 22, which are the fins after the formation of transistor is finished. In FIG. 22, the height HD0 of narrow dummy fins 25C' may be equal to the height HC1 of protruding fin 24', and is greater than the height HD1 of narrow dummy fins 25A'. It is noted that height HD4 of wide dummy fins 25B' HD0 of narrow dummy fins 25C' is greater than the height HD1 of narrow dummy fins 25A' when wide dummy fin 25B' is not etched. It is also noted that the structures shown in FIGS. 20 and 22 may exist in the same chip. Since narrow dummy fins 25C' and wide dummy fin 25B' are not etched in etching process 28, their top widths may be equal to or greater than the respective bottom width, which is different from the etched dummy fin 25A'.

FIGS. 23 through 31 illustrate amplified views of the region 74 in FIG. 11B or 13B in accordance with some embodiments. FIG. 23 is similar to FIGS. 19A and 19B, with the left part showing the features obtained from the cross-section in which no gate isolation region is formed (and hence gate is not cut), while the right part showing the features obtained from the cross section in which gate isolation region 52 is formed. The top surface of dummy fin 25' is rounded. FIG. 24 illustrates the similar structure as shown in FIG. 23, except dummy fin 25' has planar top surface and straight and tilted sidewalls. Gate isolation region 52 extends to contact the straight sidewalls of dummy fin 25'. Gate isolation region 52 may include vertical sidewalls, and slanted bottom surfaces connected to the slanted sidewalls. The slanted bottom surfaces are lower than the top surface of dummy fin 25' in accordance with some embodiments. FIG. 25 illustrates the similar structure as shown in FIG. 24, except the slanted sidewall of gate isolation region 52 extends from a level higher than the top surface of dummy fin 25' to the level lower than the top surface of dummy fin 25'.

FIGS. 26 through 32 illustrate various multi-layer dummy fin 25', which all have top widths smaller than the respective bottom widths. FIG. 26 illustrates that sub-layer 25-2 has slanted sidewalls and a rounded top surface, while sub-layer 25-1 has a planar top surface and straight and vertical sidewalls. FIG. 27 illustrates that sub-layer 25-1 has a concaved (inversed pyramid shape) top surface. FIG. 28 illustrates that sub-layer 25-1 is a conformal layer. FIGS. 29, 30, and 31 illustrate similar profiles similar to what are shown in FIGS. 26, 27, and 28, respectively, except there are three sub-layers 25-1, 25-2, and 25-3.

The embodiments of the present disclosure have some advantageous features. By performing an etching process to reduce the top widths of dummy fins to be smaller than the respective bottom widths, it is easier to etch and fill in high-aspect-ratio trenches between protruding semiconductor fins and dielectric dummy fins. As a result, the process windows for the patterning process in the formation of dummy gate stacks and forming replacement gate stacks are both enlarged.

In accordance with some embodiments of the present disclosure, a method comprises forming isolation regions extending into a semiconductor substrate, wherein semiconductor strips are located between the isolation regions; forming a dielectric dummy strip between the isolation regions; recessing the isolation regions, so that some portions of the semiconductor strips protrude higher than top surfaces of the recessed isolation regions to form protruding semiconductor fins, and a portion of the dielectric dummy strip protrudes higher than the top surfaces of the recessed isolation regions to form a dielectric dummy fin; etching the dielectric dummy fin so that a top width of the dielectric dummy fin is smaller than a bottom width of the dielectric dummy fin; and forming a gate stack on top surfaces and sidewalls of the protruding semiconductor fins and the dielectric dummy fin. In an embodiment, during the etching the dielectric dummy strip, the protruding semiconductor fins are exposed to an etching chemical used for the etching. In an embodiment, during the etching the dielectric dummy strip, the protruding semiconductor fins are protected by an etching mask. In an embodiment, the method further comprises etching the gate stack to form an opening, wherein the opening separates the gate stack into two portions, and the dielectric dummy fin is underlying and revealed through the opening; and filling a dielectric material into the opening to form a gate isolation region. In an embodiment, the method further comprises removing the two portions of the gate stack to form trenches; and forming replacement gate stacks in the trenches. In an embodiment, the method further comprises replacing the gate stack with a replacement gate stack; etching the replacement gate stack to form an opening that separates the replacement gate stack into two portions, and the dielectric dummy fin is underlying and revealed through the opening; and filling a dielectric material into the opening to form a gate isolation region. In an embodiment, before the etching the dielectric dummy fin, the top width of the dielectric dummy fin is greater than the bottom width of the dielectric dummy fin, and the top width is reduced by the etching the dielectric dummy fin more than the bottom width. In an embodiment, before the etching the dielectric dummy fin, the top width of the dielectric dummy fin is equal to the bottom width of the dielectric dummy fin, and the top width is reduced by the etching the dielectric dummy fin more than the bottom width. In an embodiment, the etching the dielectric dummy fin is performed using a dry etching process. In an embodiment, the etching the dielectric dummy fin is performed using a wet etching process. In an embodiment, after the etching, the dielectric dummy fin has a tapered profile with upper portions narrower than respective lower portions.

In accordance with some embodiments of the present disclosure, a device comprises a semiconductor substrate; isolation regions over a bulk portion of the semiconductor substrate; a semiconductor fin protruding higher than top surfaces of the isolation regions, wherein the semiconductor fin has a first lengthwise direction; and a dielectric dummy fin protruding higher than the top surfaces of the isolation regions, wherein the dielectric dummy fin has a second lengthwise direction parallel to the first lengthwise direction, wherein the dielectric dummy fin has a top width and a bottom width greater than the top width, with the top width and the bottom width being measured in a widthwise direction perpendicular to the first lengthwise direction. In an embodiment, the dielectric dummy fin is tapered, and from a bottom end of the dielectric dummy fin to a top end of the dielectric dummy fin, widths of the dielectric dummy fin reduce continuously. In an embodiment, the dielectric dummy fin has a first top surface lower than a second top surface of the semiconductor fin. In an embodiment, the device further comprises a gate stack extending on a top surface and sidewalls of the semiconductor fin; and a gate isolation region over and contacting the dielectric dummy fin, wherein a first sidewall of the gate isolation region contacts a second sidewall of the gate stack. In an embodiment, the gate isolation region comprises a vertical-and-straight sidewall, and a slanted-and-straight bottom surface connecting to a bottom end of the vertical-and-straight sidewall, wherein the slanted-and-straight bottom surface has at least a portion lower than a top end of the dielectric dummy fin, and the gate isolation region contacts an additional sidewall of the dielectric dummy fin. In an embodiment, the dielectric dummy fin comprises a plurality of sub-layers, with outer sub-layers of the plurality of sub-layers having opposing portions on opposing sides of the respective inner sub-layers of the plurality of sub-layers, and wherein top surfaces of the outer sub-layers are lower than top surfaces of the respective inner sub-layers.

In accordance with some embodiments of the present disclosure, a device comprises a dielectric dummy fin; a first protruding semiconductor fin and a second protruding semiconductor fin on opposing sides of the dielectric dummy fin, wherein a first top surface of the dielectric dummy fin is lower than second top surfaces of the first protruding semiconductor fin and the second protruding semiconductor fin; a first gate stack on the first protruding semiconductor fin; a second gate stack on the second protruding semiconductor fin; and a gate isolation region between, and contacting, the first gate stack and the second gate stack, wherein the gate isolation region is over and contacting the dielectric dummy fin. In an embodiment, the dielectric dummy fin has a tapered profile, with upper widths of upper portions of the dielectric dummy fin being increasingly smaller than lower widths of the respective lower portions of the dielectric dummy fin. In an embodiment, the device further comprises isolation regions; and a semiconductor strip between the isolation region, wherein the semiconductor strip is overlapped by the first protruding semiconductor fin, and wherein the semiconductor strip has an additional tapered profile, with upper widths of additional upper portions of the semiconductor strip being greater than lower widths of respective lower portions of the semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming isolation regions extending into a semiconductor substrate, wherein semiconductor strips are located between the isolation regions;
   forming a dielectric dummy strip between the isolation regions;
   recessing the isolation regions, so that some portions of the semiconductor strips protrude higher than top surfaces of the recessed isolation regions to form protruding semiconductor fins, and a portion of the dielectric dummy strip protrudes higher than the top surfaces of the recessed isolation regions to form a dielectric dummy fin;
   etching the dielectric dummy fin so that a top width of the dielectric dummy fin is smaller than a bottom width of the dielectric dummy fin; and
   forming a gate stack on top surfaces and sidewalls of the protruding semiconductor fins and the dielectric dummy fin.

2. The method of claim 1, wherein during the etching the dielectric dummy strip, the protruding semiconductor fins are exposed to an etching chemical used for the etching.

3. The method of claim 1, wherein during the etching the dielectric dummy strip, the protruding semiconductor fins are protected by an etching mask.

4. The method of claim 1 further comprising:
   etching the gate stack to form an opening, wherein the opening separates the gate stack into two portions, and the dielectric dummy fin is underlying and revealed through the opening; and
   filling a dielectric material into the opening to form a gate isolation region.

5. The method of claim 4 further comprising:
   removing the two portions of the gate stack to form trenches; and
   forming replacement gate stacks in the trenches.

6. The method of claim 1 further comprising:
   replacing the gate stack with a replacement gate stack;
   etching the replacement gate stack to form an opening that separates the replacement gate stack into two portions, and the dielectric dummy fin is underlying and revealed through the opening; and
   filling a dielectric material into the opening to form a gate isolation region.

7. The method of claim 1, wherein before the etching the dielectric dummy fin, the top width of the dielectric dummy fin is greater than the bottom width of the dielectric dummy fin, and the top width is reduced by the etching the dielectric dummy fin more than the bottom width.

8. The method of claim 1, wherein before the etching the dielectric dummy fin, the top width of the dielectric dummy fin is equal to the bottom width of the dielectric dummy fin, and the top width is reduced by the etching the dielectric dummy fin more than the bottom width.

9. The method of claim 1, wherein the etching the dielectric dummy fin is performed using a dry etching process.

10. The method of claim 1, wherein the etching the dielectric dummy fin is performed using a wet etching process.

11. The method of claim 1, wherein after the etching, the dielectric dummy fin has a tapered profile with upper portions narrower than respective lower portions.

12. A device comprising:
a semiconductor substrate;
isolation regions over a bulk portion of the semiconductor substrate;
a semiconductor fin protruding higher than top surfaces of the isolation regions, wherein the semiconductor fin has a first lengthwise direction; and
a dielectric dummy fin protruding higher than the top surfaces of the isolation regions, wherein the dielectric dummy fin has a second lengthwise direction parallel to the first lengthwise direction, wherein the dielectric dummy fin has a top width and a bottom width greater than the top width, with the top width and the bottom width being measured in a widthwise direction perpendicular to the first lengthwise direction, and wherein the dielectric dummy fin has a first top surface lower than a second top surface of the semiconductor fin.

13. The device of claim 12, wherein the dielectric dummy fin is tapered, and from a bottom end of the dielectric dummy fin to a top end of the dielectric dummy fin, widths of the dielectric dummy fin reduce continuously.

14. The device of claim 12 further comprising:
a gate stack extending on a top surface and sidewalls of the semiconductor fin; and
a gate isolation region over and contacting the dielectric dummy fin, wherein a first sidewall of the gate isolation region contacts a second sidewall of the gate stack.

15. The device of claim 14, wherein the gate isolation region comprises:
a vertical-and-straight sidewall, and a slanted-and-straight bottom surface connecting to a bottom end of the vertical-and-straight sidewall, wherein the slanted-and-straight bottom surface has at least a portion lower than a top end of the dielectric dummy fin, and the gate isolation region contacts an additional sidewall of the dielectric dummy fin.

16. The device of claim 12, wherein the dielectric dummy fin comprises a plurality of sub-layers, with outer sub-layers of the plurality of sub-layers having opposing portions on opposing sides of the respective inner sub-layers of the plurality of sub-layers, and wherein top surfaces of the outer sub-layers are lower than top surfaces of the respective inner sub-layers.

17. A device comprising:
a dielectric dummy fin;
a first protruding semiconductor fin and a second protruding semiconductor fin on opposing sides of the dielectric dummy fin, wherein a first top surface of the dielectric dummy fin is lower than second top surfaces of the first protruding semiconductor fin and the second protruding semiconductor fin;
a first gate stack on the first protruding semiconductor fin;
a second gate stack on the second protruding semiconductor fin; and
a gate isolation region between, and contacting, the first gate stack and the second gate stack, wherein the gate isolation region is over and contacting the dielectric dummy fin.

18. The device of claim 17, wherein the dielectric dummy fin has a tapered profile, with upper widths of upper portions of the dielectric dummy fin being increasingly smaller than lower portions of the respective lower widths of the dielectric dummy fin.

19. The device of claim 18 further comprising:
isolation regions; and
a semiconductor strip between the isolation region, wherein the semiconductor strip is overlapped by the first protruding semiconductor fin, and wherein the semiconductor strip has an additional tapered profile, with upper widths of additional upper portions of the semiconductor strip being greater than lower widths of respective lower portions of the semiconductor strip.

20. The device of claim 12, wherein the dielectric dummy fin is comprised in a dielectric strip, with the dielectric strip penetrating through the isolation regions, and wherein the dielectric strip forms vertical interfaces with the isolation regions.

* * * * *